US012218209B2

(12) United States Patent
Lin et al.

(10) Patent No.: US 12,218,209 B2
(45) Date of Patent: *Feb. 4, 2025

(54) CONTACTS FOR SEMICONDUCTOR DEVICES AND METHODS OF FORMING THE SAME

(71) Applicant: Taiwan Semiconductor Manufacturing Co., Ltd., Hsinchu (TW)

(72) Inventors: Meng-Han Lin, Hsinchu (TW); Sai-Hooi Yeong, Zhubei (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/517,458

(22) Filed: Nov. 22, 2023

(65) Prior Publication Data
US 2024/0088244 A1 Mar. 14, 2024

Related U.S. Application Data

(63) Continuation of application No. 17/814,325, filed on Jul. 22, 2022, now Pat. No. 11,855,162, which is a (Continued)

(51) Int. Cl.
*H01L 29/417* (2006.01)
*H01L 21/8234* (2006.01)
(Continued)

(52) U.S. Cl.
CPC .............. *H01L 29/41775* (2013.01); *H01L 21/823456* (2013.01); *H01L 21/823462* (2013.01);
(Continued)

(58) Field of Classification Search
CPC ........... H01L 29/66621; H01L 29/1079; H01L 29/42364; H01L 29/513; H01L 21/823857;
(Continued)

(56) References Cited

U.S. PATENT DOCUMENTS 7,205,630 B2 4/2007 Chang et al.
11,417,739 B2 * 8/2022 Lin ..................... H01L 29/1079
(Continued)

*Primary Examiner* — Joseph C. Nicely
(74) *Attorney, Agent, or Firm* — Slater Matsil, LLP

(57) ABSTRACT

Methods for forming contacts to source/drain regions and gate electrodes in low- and high-voltage devices and devices formed by the same are disclosed. In an embodiment a device includes a first channel region in a substrate adjacent a first source/drain region; a first gate over the first channel region; a second channel region in the substrate adjacent a second source/drain region, a top surface of the second channel region being below a top surface of the first channel region; a second gate over the second channel region; an ILD over the first gate and the second gate; a first contact extending through the ILD and coupled to the first source/drain region; and a second contact extending through the ILD, coupled to the second source/drain region, and having a width greater a width of the first contact and a height greater than a height of the first contact.

20 Claims, 14 Drawing Sheets

Related U.S. Application Data continuation of application No. 17/146,205, filed on Jan. 11, 2021, now Pat. No. 11,417,739.

(60) Provisional application No. 63/090,799, filed on Oct. 13, 2020.

(51) Int. Cl.

| | |
|---|---|
| *H01L 21/8238* | (2006.01) |
| *H01L 27/088* | (2006.01) |
| *H01L 27/092* | (2006.01) |
| *H01L 29/10* | (2006.01) |
| *H01L 29/40* | (2006.01) |
| *H01L 29/423* | (2006.01) |
| *H01L 29/51* | (2006.01) |
| *H01L 29/66* | (2006.01) |

(52) U.S. Cl.
CPC ........... *H01L 21/823475* (2013.01); *H01L 21/823857* (2013.01); *H01L 21/823871* (2013.01); *H01L 27/088* (2013.01); *H01L 27/0922* (2013.01); *H01L 29/1079* (2013.01); *H01L 29/401* (2013.01); *H01L 29/42364* (2013.01); *H01L 29/513* (2013.01); *H01L 29/66545* (2013.01); *H01L 29/66606* (2013.01); *H01L 29/66621* (2013.01)

(58) Field of Classification Search
CPC ..... H01L 21/823462; H01L 21/823456; H01L 21/823475; H01L 21/823871; H01L 27/0922
See application file for complete search history.

(56) References Cited

U.S. PATENT DOCUMENTS

| | | |
|---|---|---|
| 2011/0018068 A1 | 1/2011 | Depetro et al. |
| 2017/0194320 A1* | 7/2017 | Chen ................ H01L 29/42368 |
| 2017/0207127 A1 | 7/2017 | Li et al. |
| 2020/0043939 A1 | 2/2020 | Wu et al. |
| 2020/0075614 A1* | 3/2020 | Huang .............. H01L 29/42328 |
| 2020/0303508 A1 | 9/2020 | Yun et al. |
| 2021/0184008 A1 | 6/2021 | Cheng et al. |
| 2021/0343704 A1* | 11/2021 | Lin ................ H01L 21/823418 |

* cited by examiner

CONTACTS FOR SEMICONDUCTOR DEVICES AND METHODS OF FORMING THE SAME

PRIORITY CLAIM AND CROSS-REFERENCE

This application is a continuation of U.S. patent application Ser. No. 17/814,325, entitled "Contacts for Semiconductor Devices and Methods of Forming the Same," filed Jul. 22, 2022, now U.S. Pat. No. 11,855,162, issued Dec. 26, 2023, which is a continuation of U.S. patent application Ser. No. 17/146,205, entitled "Contacts for Semiconductor Devices and Methods of Forming the Same," filed Jan. 11, 2021, now U.S. Pat. No. 11,417,739, issued Aug. 16, 2022, which application claims the benefit of U.S. Provisional Patent Application No. 63/090,799, filed on Oct. 13, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
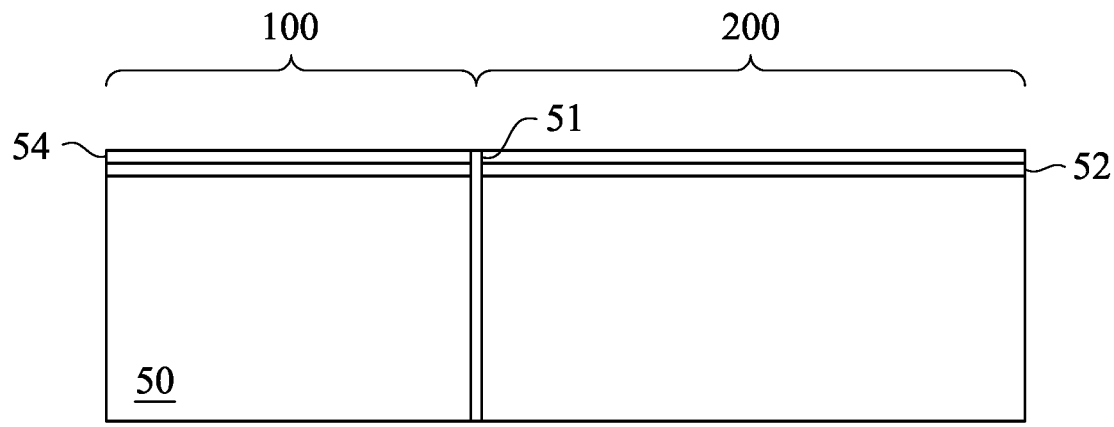
FIGS. 1, 2, 3, 4, 5, 6, 7, 8, 9, 10, 11, 12, 13, 14, 15, 16, 17, 18, 19A, 19B, 19C, 19D, 19E, 20A, 20B, 20C, 21A, 21B, and 21C are cross-sectional and top-down views of intermediate stages in the manufacturing of field effect transistors (FETs), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for forming contacts for low-voltage semiconductor devices and high-voltage semiconductor devices and semiconductor devices formed by the same. The method includes forming low-voltage semiconductor devices in a first region of a substrate and forming high-voltage semiconductor regions in a second region of the substrate. The second region of the substrate is recessed below the first region of the substrate. Gates are formed in the first region and the second region, with the gates in the second region having heights greater than the gates in the first region. One or more interlayer dielectrics are formed over the first region and the second region. A patterned photoresist is formed over the interlayer dielectrics and is used to form openings exposing first source/drain regions in the first region, second source/drain regions in the second region, and the gates in the first region and the second region.

The photoresist is patterned to include first openings over the first source/drain regions, second openings over the second source/drain regions, and third openings over the gates. The second openings may have widths greater than the first openings and the third openings and the first openings may have widths equal to or greater than the third openings. As the width of the openings increases, the etch rate of the underlying interlayer dielectrics may increase. As a result, the different widths of the openings may be used to expose the first source/drain regions, the second source/drain regions, and the gates, which are disposed at different heights, without over-etching the first source/drain regions, the second source/drain regions, or the gates. This reduces device defects and improves device performance. Moreover, masking steps may be eliminated, which reduces costs.

Some embodiments discussed herein are discussed in the context of planar FETs formed using a gate-last process. In other embodiments, a gate-first process may be used. Also, some embodiments contemplate aspects used in fin field effect transistors (FinFETs), nanostructure (e.g., nanosheet, nanowire, gate-all-around, or the like) field effect transistors (NSFETs), or the like.

In FIG. 1, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a low-voltage (LV) device region 100 and a high-voltage (HV) device region 200. The LV device region 100 is a region in which a low-voltage device, such as a low-voltage metal-oxide-semiconductor (MOS) device is to be formed. The HV device region 200 is a region in which a high-voltage device, such as a high-voltage MOS device is to be formed. The LV device is configured to operate at operation voltages and power supply voltages lower than the respective operation voltages and power supply voltages of the HV device. It is appreciated that the concepts of HV and LV are relative to one another. The maximum voltages that can be endured without damage by the LV device are lower than the maximum voltages that can be endured without damage by the HV device. In some embodiments, the operation voltages and power supply voltages of the HV device are between about 2.5 V and about 15 V and the operation voltages and power supply voltages of the LV device are between about 0.5 V and about 1 V. The LV device region 100 may be physically separated from the HV device region 200 (as illustrated by divider 51), and any number of device features (e.g., other active devices, doped regions, isolation structures, or the like) may be disposed between the LV device region 100 and the HV device region 200.

Further in FIG. 1, a pad layer 52 and a mask layer 54 are formed on substrate 50. The pad layer 52 may include a thin film of silicon oxide or the like, which may be formed using a thermal oxidation process or the like. In some embodiments, the pad layer 52 may comprise silicon nitride, silicon oxynitride, combinations or multiple layers thereof, or the like. The pad layer 52 may act as an adhesion layer between the substrate 50 and the mask layer 54. The pad layer 52 may also act as an etch stop layer for etching the mask layer 54. In some embodiments, the mask layer 54 is formed of silicon nitride or the like. In some embodiments, the mask layer 54 may comprise silicon oxynitride, polysilicon, combinations or multiple layers thereof, or the like. The mask layer 54 may be formed by chemical vapor deposition (CVD), atomic layer deposition (ALD), or the like. The mask layer 54 may be used as a hard mask during a subsequent photolithography process.

Figure 2:
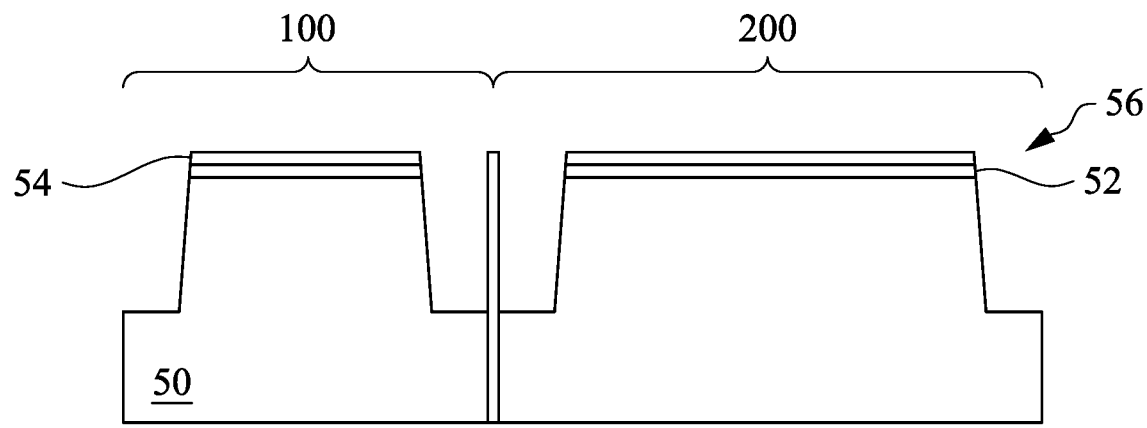

In FIG. 2, the mask layer 54, the pad layer 52, and the substrate 50 are etched to form trenches 56. A first patterned mask (not separately illustrated), such as a patterned photoresist, may be formed over the mask layer 54. The first patterned mask may be formed by depositing a first photosensitive layer over the mask layer 54 using spin-on coating or the like. The first photosensitive layer may then be patterned by exposing the first photosensitive layer to a patterned energy source (e.g., a patterned light source) and developing the first photosensitive layer to remove an exposed or unexposed portion of the first photosensitive layer, thereby forming the first patterned mask. The mask layer 54, the pad layer 52, and the substrate 50 may be etched by a suitable etching process, such as reactive ion etching (RIE), neutral beam etching (NBE), the like, or a combination thereof in order to transfer the pattern of the first patterned mask to the mask layer 54, the pad layer 52, and the substrate 50, forming the trenches 56. In some embodiments, the etching process may be anisotropic. The first patterned mask may then be removed by any acceptable process, such as an ashing process, a stripping process, the like, or a combination thereof.

Figure 3:
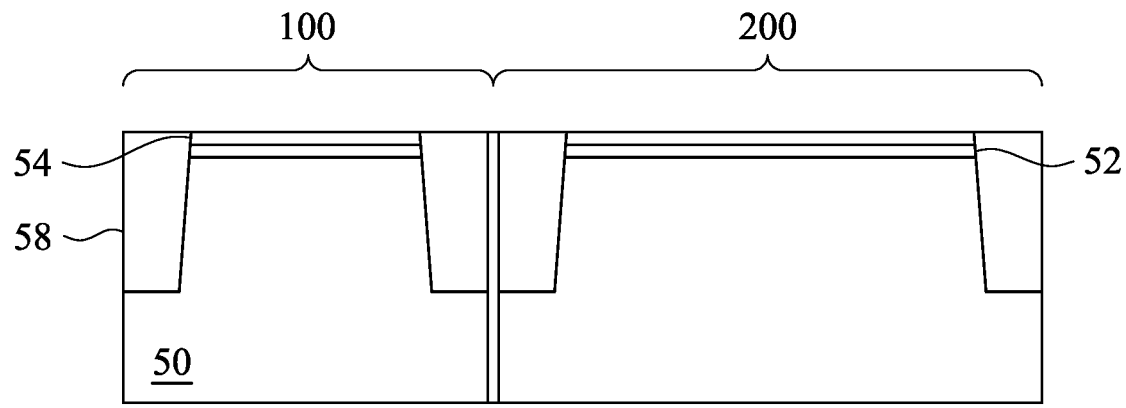

In FIG. 3, shallow trench isolation (STI) regions 58 are formed in the trenches 56 adjacent the mask layer 54, the pad layer 52, and the substrate 50. The STI regions 58 may be formed by forming an insulation material (not separately illustrated) filling the trenches 56 and extending along top surfaces and side surfaces of the substrate 50, side surfaces of the pad layer 52, and top surfaces and side surfaces of the mask layer 54. The insulation material may be an oxide, such as silicon oxide, a nitride, the like, or a combination thereof, and may be formed by a high-density plasma chemical vapor deposition (HDP-CVD), a flowable CVD (FCVD) (e.g., a CVD-based material deposition in a remote plasma system with post curing to convert the deposited material to another material, such as an oxide), the like, or a combination thereof. Other insulation materials formed by any acceptable process may be used. In the illustrated embodiment, the insulation material is silicon oxide formed by an FCVD process. An anneal process may be performed once the insulation material is formed. In some embodiments, the insulation material is formed such that excess insulation material covers the mask layer 54. The insulation material may comprise a single layer or may utilize multiple layers. For example, in some embodiments, a liner (not separately illustrated) may first be formed along surfaces of the substrate 50, the pad layer 52, and the mask layer 54. Thereafter, a fill material, such as those discussed above may be formed over the liner.

A removal process is then applied to the insulation material to remove excess insulation material over the mask layer 54. In some embodiments, a planarization process such as a chemical mechanical polish (CMP), an etch-back process, combinations thereof, or the like may be utilized. The removal process may planarize the insulation material and the mask layer 54, forming the STI regions 58. The removal process exposes the mask layer 54 such that top surfaces of the mask layer 54 and the STI regions 58 are level after the planarization process is complete.

Figure 4:
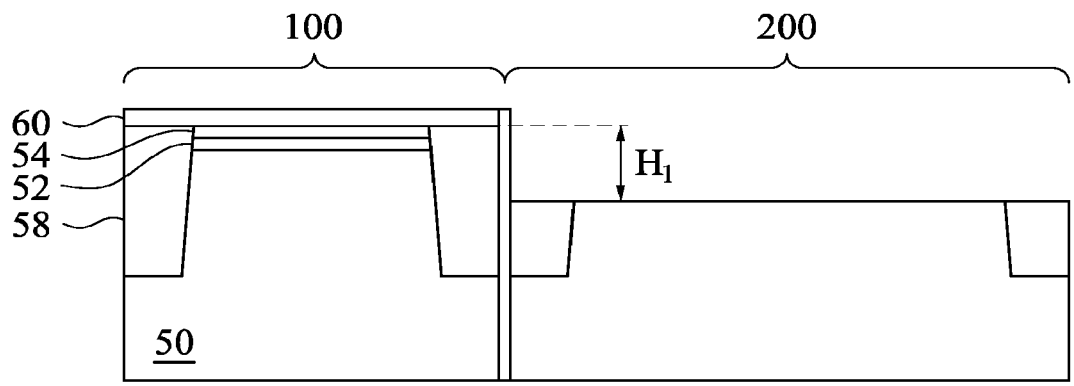

In FIG. 4, a second patterned mask 60 is formed over the LV device region 100 and the STI regions 58, the mask layer 54, the pad layer 52, and the substrate 50 are etched in the HV device region 200. The second patterned mask 60 may be a patterned photoresist. The second patterned mask 60 may be formed by depositing a second photosensitive layer over the mask layer 54 and the STI regions 58 using spin-on coating or the like. The second photosensitive layer may then be patterned by exposing the second photosensitive layer to a patterned energy source (e.g., a patterned light source) and developing the second photosensitive layer to remove an exposed or unexposed portion of the second photosensitive layer, thereby forming the second patterned mask 60 covering the LV device region 100 and exposing the HV device region 200. The mask layer 54, the pad layer 52, the substrate 50, and the STI regions 58 in the HV device region 200 may then be etched by a suitable etching process. The etching process may be a wet etching process a dry etching process, or the like. In some embodiments, the etching process may be reactive ion etching (RIE), neutral beam etching (NBE), the like, or a combination thereof. In some embodiments, the etching process may be anisotropic. In some embodiments, the mask layer 54, the pad layer 52, and the substrate 50 may be etched separately from the STI regions 58. The mask layer 54, the pad layer 52, and the substrate 50 may be etched before or after etching the STI regions 58.

As illustrated in FIG. 4, top surfaces of the mask layer 54 and the STI regions 58 in the LV device region 100 may be disposed above top surfaces of the substrate 50 and the STI regions 58 in the HV device region 200 in a direction perpendicular to a major surface of the substrate 50. The top surfaces of the mask layer 54 and the STI regions 58 in the LV device region 100 may be disposed above the top surfaces of the substrate 50 and the STI regions 58 in the HV device region 200 by a height $H_1$ ranging from about 50 nm to about 350 nm. Gate structures subsequently formed in the HV device region 200 may have heights greater than gate structures subsequently formed in the LV device region 100. Recessing the substrate 50 and the STI regions 58 in the HV device region 200 allows for subsequently formed gate structures in the LV device region 100 and the HV device region 200 to be formed simultaneously.

Figure 5:
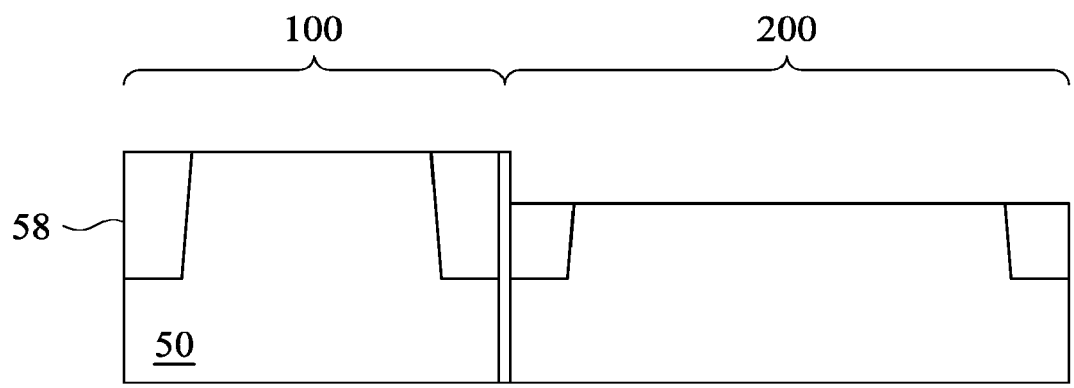

In FIG. 5, the second patterned mask 60, the mask layer 54, and the pad layer 52 are removed from the LV device region 100. The second patterned mask 60 may be removed by any acceptable process, such as an ashing process, a stripping process, the like, or a combination thereof. In embodiments in which the mask layer 54 comprises silicon nitride and the pad layer 52 comprises silicon oxide, the mask layer 54 may be removed by a wet clean process using phosphoric acid ($H_3PO_4$) or the like and the pad layer 52 may be removed in a wet etching process using diluted hydrofluoric acid (dHF) or the like. The STI regions 58 may also be recessed such that top surfaces of the STI regions 58 are substantially co-planar with top surfaces of the substrate 50. In some embodiments, a planarization process, such as a CMP process, may be performed to level top surfaces of the STI regions 58 in the LV device region 100 with top surfaces of the substrate 50. In some embodiments, the HV device region 200 may be masked while the planarization process is performed on the LV device region 100.

Figure 6:
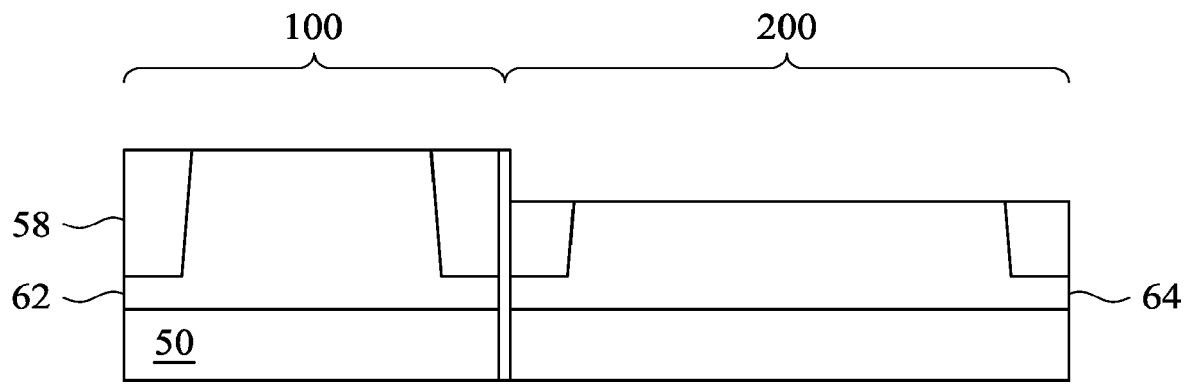

In FIG. 6, a first well 62 is formed in the substrate 50 in the LV device region 100 and a second well 64 is formed in the substrate 50 in the HV device region 200. In some embodiments, the first well 62 and the second well 64 may be doped with the same or different dopants and the first well 62 and the second well 64 may be doped to the same or different dopant concentrations. Further, either of the first well 62 and the second well 64 may be implanted with n-type or p-type dopants. In the embodiments with different dopants or dopant concentrations, the different implant steps for the LV device region 100 and the HV device region 200 may be achieved using a photoresist or other masks (not separately illustrated). For example, a photoresist may be formed over the substrate 50 and the STI regions 58 in the LV device region 100. The photoresist is patterned to expose the HV device region 200 of the substrate 50. The photoresist can be formed by using a spin-on technique and can be patterned using acceptable photolithography techniques. Once the photoresist is patterned, an impurity implant is performed in the HV device region 200, and the photoresist may act as a mask to prevent the impurities from being implanted into the LV device region 100. The impurities may be phosphorus, arsenic, antimony, boron, boron fluoride, indium, or the like implanted in the region to a concentration of equal to or less than $1\times10^{18}$ atoms/cm$^3$, such as between about $1\times10^{16}$ atoms/cm$^3$ and about $1\times10^{18}$ atoms/cm$^3$. After the implant, the photoresist is removed, such as by an acceptable ashing process.

Following the implanting of the HV device region 200, a photoresist is formed over the substrate 50 and the STI regions 58 in the HV device region 200. The photoresist is patterned to expose the LV device region 100 of the substrate 50. The photoresist can be formed by using a spin-on technique and can be patterned using acceptable photolithography techniques. Once the photoresist is patterned, an impurity implant may be performed in the LV device region 100, and the photoresist may act as a mask to prevent the impurities from being implanted into the HV device region 200. The p-type impurities may be phosphorus, arsenic, antimony, boron, boron fluoride, indium, or the like implanted in the region to a concentration of equal to or less than $1\times10^{18}$ atoms/cm$^3$, such as between about $1\times10^{16}$ atoms/cm$^3$ and about $1\times10^{18}$ atoms/cm$^3$. After the implant, the photoresist may be removed, such as by an acceptable ashing process. After the implants of the LV device region 100 and the HV device region 200, an anneal may be performed to repair implant damage and to activate the impurities that were implanted. The first well 62 and the second well 64 are illustrated as having bottom surfaces disposed below bottom surfaces of the STI regions 58 and extending below the STI regions 58. In some embodiments, the first well 62 and the second well 64 do not extend below the STI regions 58. In some embodiments, bottom surfaces of the STI regions 58 are disposed below bottom surfaces of the first well 62 and/or the second well 64.

Figure 7:
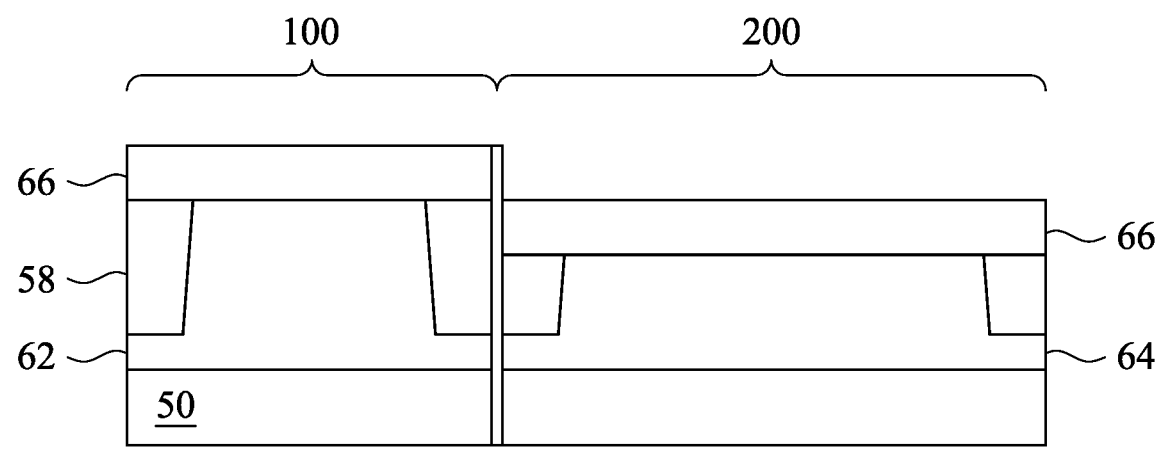

In FIG. 7, a first gate dielectric layer 66 is formed over the STI regions 58, the first well 62, and the second well 64. The first gate dielectric layer 66 may be a dielectric material, which may include an oxide, such as silicon oxide; a nitride, such as silicon nitride; a composite structure, such as an oxide/nitride/oxide; combinations or multiple layers thereof; or the like. The first gate dielectric layer 66 may be formed by a deposition process such as CVD, ALD, or the like. In some embodiments, the first gate dielectric layer 66 forms a gate oxide for a subsequently formed high-voltage transistor. The first gate dielectric layer 66 may have a thickness from about 10 nm to about 100 nm.

Figure 8:
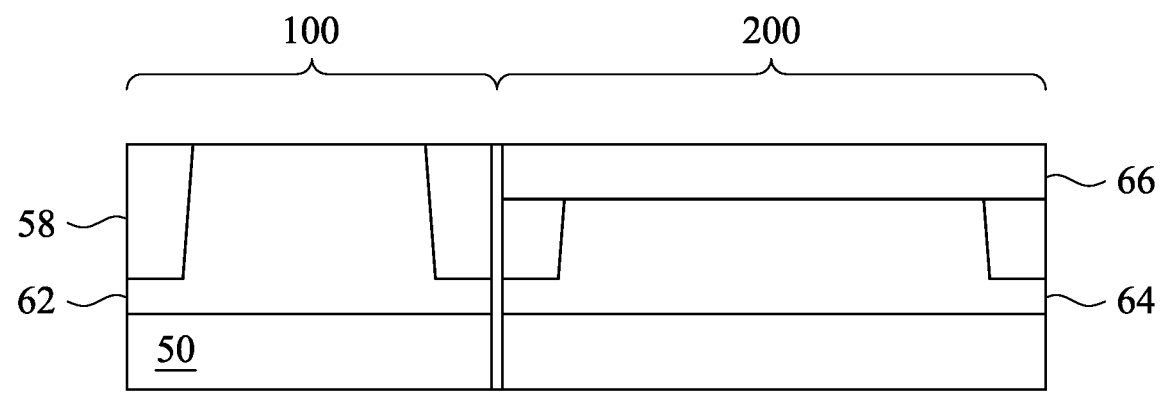

In FIG. 8, the first gate dielectric layer 66 is removed from the LV device region 100. The first gate dielectric layer 66 may be removed by acceptable photolithography and etching processes. As illustrated in FIG. 8, a top surface of the first gate dielectric layer 66 in the HV device region 200 may be coplanar with top surfaces of the first well 62 and the STI regions 58 in the LV device region 100. Top surfaces of the first well 62 and the STI regions 58 may be exposed after removing the first gate dielectric layer 66 from the LV device region 100. In some embodiments, the top surface of the first gate dielectric layer 66 in the HV device region 200 may be above or below the top surfaces of the first well 62 and the STI regions 58 in the LV device region 100.

Figure 9:
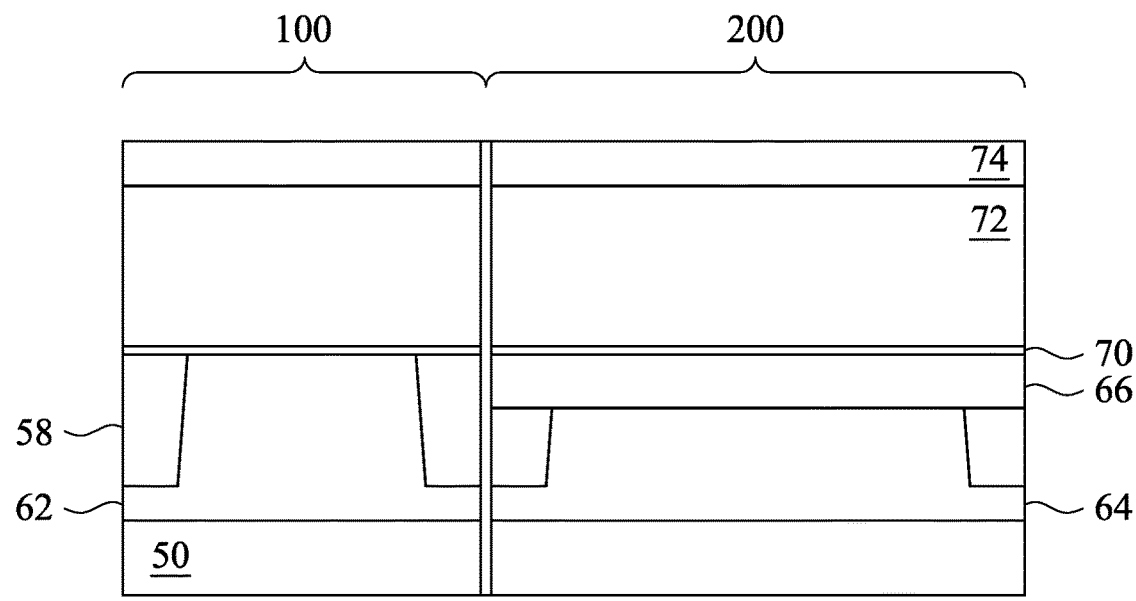

In FIG. 9, a second gate dielectric layer 70 is formed over the STI regions 58, the first well 62, and the first gate dielectric layer 66. The second gate dielectric layer 70 may be, for example, silicon oxide, silicon nitride, a combination thereof, or the like, and may be deposited or thermally grown according to acceptable techniques. A gate layer 72 is formed over the second gate dielectric layer 70, and a mask layer 74 is formed over the gate layer 72. The gate layer 72 may be deposited over the second gate dielectric layer 70 and then planarized, such as by a CMP. The mask layer 74 may be deposited over the gate layer 72. The gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The gate layer 72 may be deposited by physical vapor deposition (PVD), CVD, sputter deposition, or other techniques for depositing the selected material. The gate layer 72 may be made of other materials that have a high etching selectivity from the etching of isolation regions, e.g., the STI regions 58, the first gate dielectric layer 66 and/or the second gate dielectric layer 70. The mask layer 74 may include one or more layers of, for example, silicon nitride, silicon oxynitride, or the like. In the embodiment illustrated in FIG. 9, a single gate layer 72 and a single mask layer 74 are formed across the LV device region 100 and the HV device region 200. It is noted that the second gate dielectric layer 70 is shown covering the first well 62 and the STI regions 58 for illustrative purposes. In some embodiments, the second gate dielectric layer 70 may be deposited such that the second gate dielectric layer 70 only covers the first well 62 and the first gate dielectric layer 66.

Figure 10:
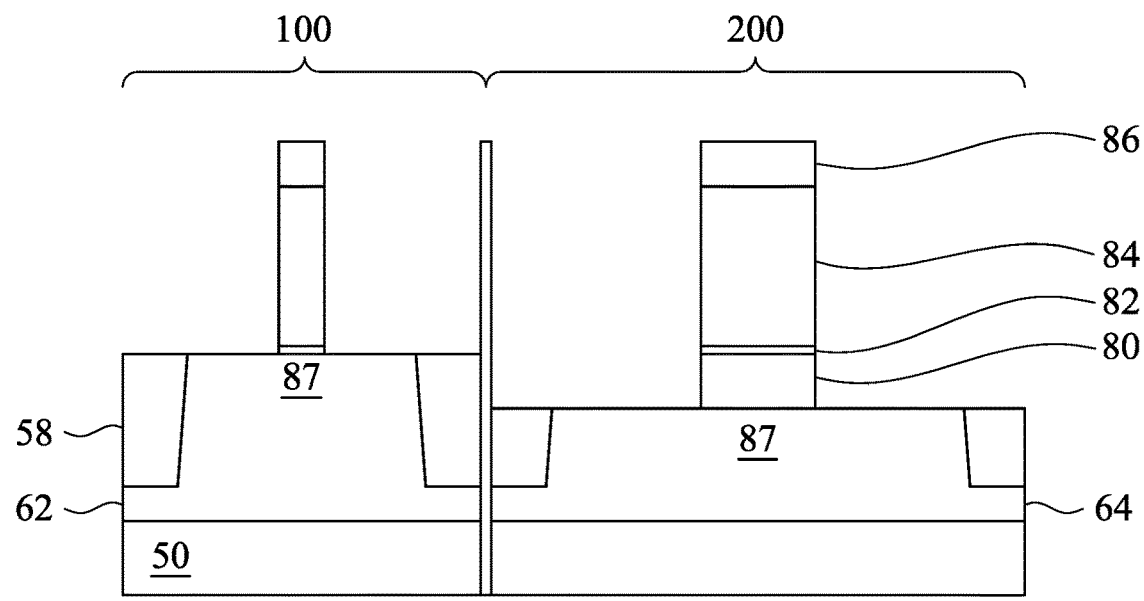

In FIG. 10, the mask layer 74 (see FIG. 7) may be patterned using acceptable photolithography and etching techniques to form masks 86. The pattern of the masks 86 may then be transferred to the gate layer 72 to form gates 84. In some embodiments, the pattern of the masks 86 may also be transferred to the second gate dielectric layer 70 in the LV device region 100 and the HV device region 200 to form second gate dielectrics 82 and may be transferred to the first gate dielectric layer 66 in the HV device region 200 to form a first gate dielectric 80. The pattern of the masks 86 may be transferred by acceptable etching techniques. The gates 84 cover respective channel regions 87 of the first well 62 and the second well 64. The pattern of the masks 86 physically separates each of the gates 84 from adjacent gates.

After the patterning of the mask layer 74, the gate layer 72, the second gate dielectric layer 70, and the first gate dielectric layer 66 to form the masks 86, the gates 84, the second gate dielectrics 82, and the first gate dielectric 80, implants for lightly doped source/drain (LDD) regions (not separately illustrated) may be performed. In embodiments in which the LV device region 100 and the HV device region 200 have different device types, similar to the implants discussed above in FIG. 6, a mask, such as a photoresist, may be formed over the HV device region 200, while exposing the LV device region 100, and appropriate type (e.g., n-type or p-type) impurities may be implanted into the exposed first well 62 in the LV device region 100. The mask may then be removed. Subsequently, a mask, such as a photoresist, may be formed over the LV device region 100 while exposing the HV device region 200, and appropriate type impurities (e.g., n-type or p-type) may be implanted into the exposed second well 64 in the HV device region 200. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ atoms/cm$^3$ to about 109 atoms/cm$^3$. An anneal may be used to repair implant damage and to activate the implanted impurities.

It is noted that the above disclosure generally describes a process of forming spacers and LDD regions. Other processes and sequences may be used. For example, fewer or additional spacers may be utilized. In some embodiments, gate seal spacers (not separately illustrated) may be formed along sidewalls of the masks 86, the gates 84, the second gate dielectrics 82, and the first gate dielectric 80, and the LDD regions may be formed after forming the gate seal spacers. Furthermore, n-type and p-type devices may be formed using a different structures and steps. For example, LDD regions for n-type devices may be formed prior to forming the gate seal spacers while the LDD regions for p-type devices may be formed after forming the gate seal spacers.

Figure 11:
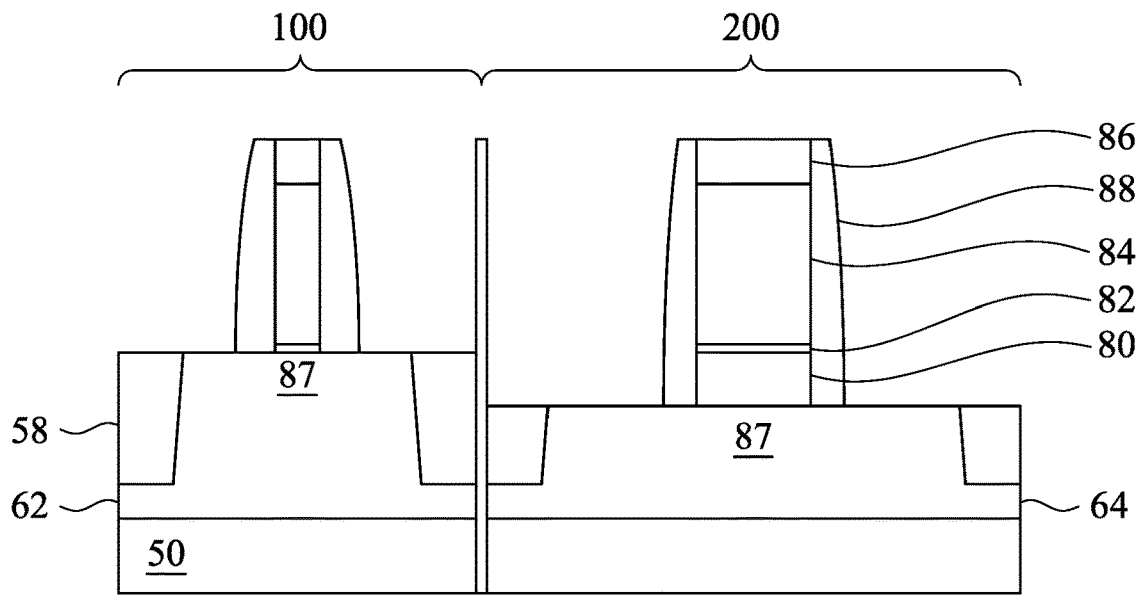

In FIG. 11, gate spacers 88 are formed along sidewalls of the masks 86, the gates 84, the second gate dielectrics 82, and the first gate dielectric 80. The gate spacers 88 may be formed by conformally depositing an insulating material and subsequently anisotropically etching the insulating material. The insulating material of the gate spacers 88 may be silicon oxide, silicon nitride, silicon oxynitride, silicon carbonitride, a combination thereof, or the like.

Figure 12:
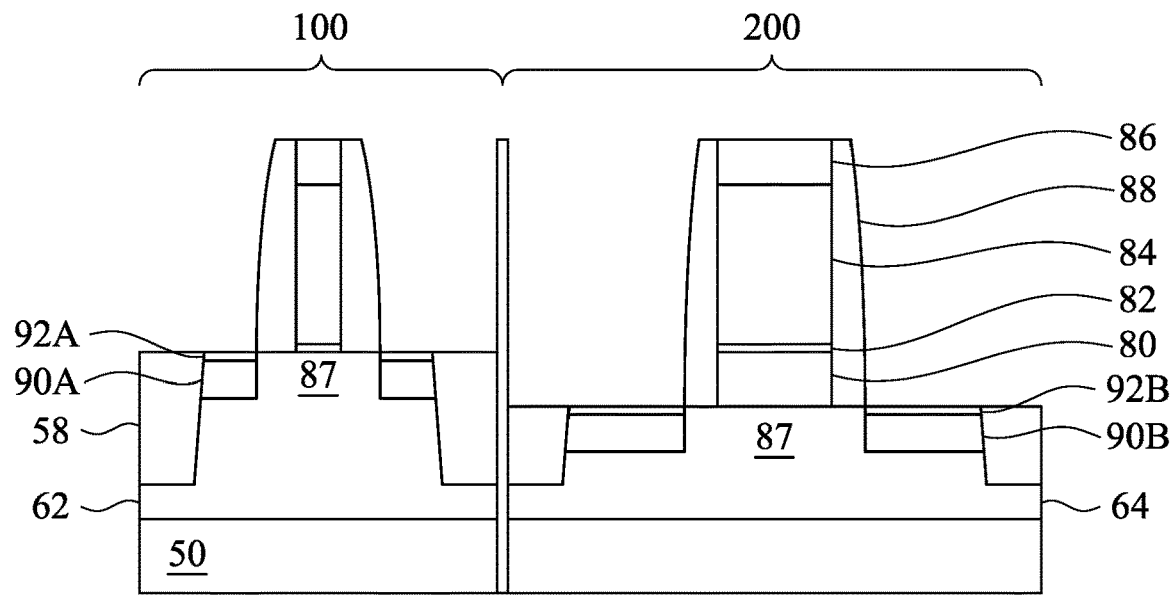

In FIG. 12, source/drain regions 90A and 90B are formed in the first well 62 and the second well 64, respectively. The source/drain regions 90A and 90B may be formed by an implantation process, an etching process followed by an epitaxial growth process, or the like. The source/drain regions 90A are formed in the first well 62 so that the gate 84 in the LV device region 100 is disposed between respective neighboring pairs of the source/drain regions 90A. Similarly, the source/drain regions 90B are formed in the second well 64 so that the gate 84 in the HV device region 200 is disposed between respective neighboring pairs of the source/drain regions 90B. In some embodiments, the gate spacers 88 are used to separate the source/drain regions 90A and 90B from the gates 84 by an appropriate lateral distance so that the source/drain regions 90A and 90B do not short out subsequently formed gates of the resulting FETs.

In embodiments in which the source/drain regions 90A and 90B are formed by an epitaxial growth process, the source/drain regions 90A in the LV device region 100 may be formed by masking the HV device region 200 and etching source/drain regions of the first well 62 in the LV device region 100 to form recesses in the first well 62. Then, the source/drain regions 90A in the LV device region 100 are epitaxially grown in the recesses. The source/drain regions 90A may include any acceptable material, such as silicon, silicon carbide, phosphorous-doped silicon carbide, silicon phosphide, silicon germanium, boron-doped silicon germanium, germanium, germanium tin, or the like. Materials of the source/drain regions 90A may be selected to exert stress in the respective channel regions 87, thereby improving performance. In some embodiments, the source/drain regions 90A in the LV device region 100 may have surfaces raised from respective surfaces of the first well 62 and may have facets.

The source/drain regions 90B in the HV device region 200 may be formed by masking the LV device region 100 and etching source/drain regions of the second well 64 in the HV device region 200 to form recesses in the second well 64. Then, the source/drain regions 90B in the HV device region 200 are epitaxially grown in the recesses. The source/drain regions 90B may include any acceptable material, such as silicon, silicon carbide, phosphorous-doped silicon carbide, silicon phosphide, silicon germanium, boron-doped silicon germanium, germanium, germanium tin, or the like. Materials of the source/drain regions 90B may be selected to exert stress in the respective channel regions 87, thereby improving performance. In some embodiments, the source/drain regions 90B in the HV device region 200 may have surfaces raised from respective surfaces of the second well 64 and may have facets.

In embodiments in which the source/drain regions 90A and 90B are formed by implantation or by epitaxial growth, the source/drain regions 90A and 90B, the first well 62, and/or the second well 64 may be implanted with dopants to form the source/drain regions, similar to the process previously discussed for forming lightly-doped source/drain regions, followed by an anneal. The source/drain regions 90A and 90B may have an impurity concentration of between about $10^{19}$ atoms/cm$^3$ and about $10^{21}$ atoms/cm$^3$. The n-type and/or p-type impurities for the source/drain regions 90A and 90B may be any of the impurities previously discussed. In some embodiments, the source/drain regions 90A and 90B may be in situ doped during growth.

Further in FIG. 12, silicide regions 92A and 92B are formed over the source/drain regions 90A and 90B in the LV device region 100 and the HV device region 200, respectively. The silicide regions 92A and 92B may be formed by forming a metal layer (not separately illustrated) over the source/drain regions 90A and 90B, performing an annealing to form the silicide regions 92A and 92B, and removing un-reacted portions of the metal layer.

Figure 13:
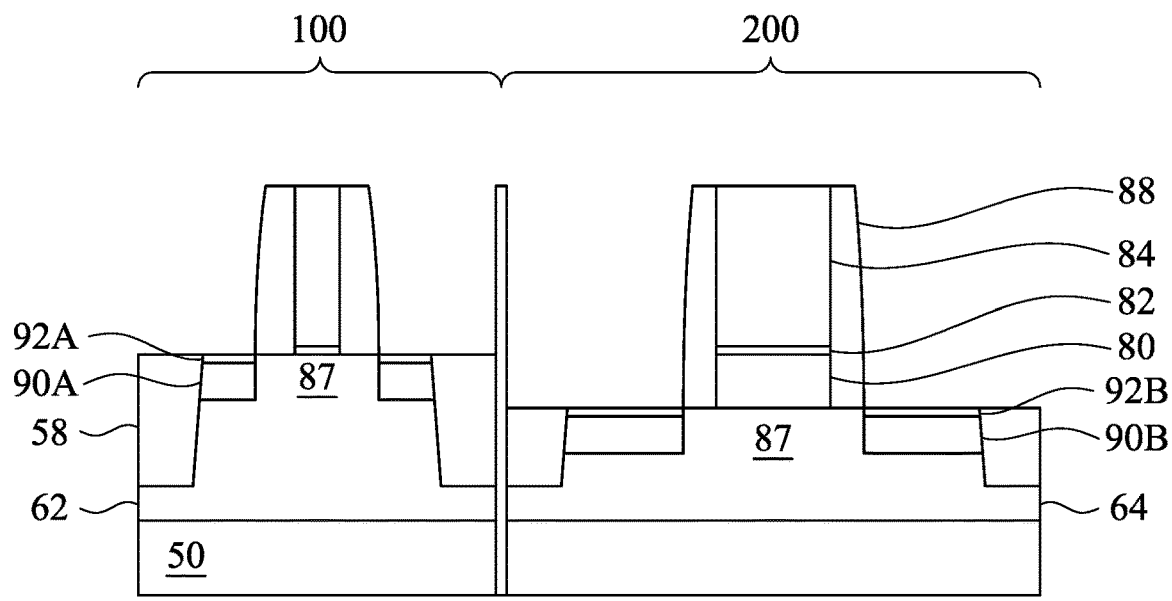

In FIG. 13, the masks 86 are removed and the gate spacers 88 are etched. In some embodiments, a planarization process, such as a CMP, may be performed to level top surfaces of the gates 84 with top surfaces of the gate spacers 88. In some embodiments, the masks 86 may be removed and the gate spacers 88 may be etched by one or more suitable etching processes, which may be isotropic or anisotropic. In some embodiments, the masks 86 and the gate spacers 88 may be etched by a dry etching process having a high etching selectivity to materials of the masks 86 and the gate spacers 88 relative to materials of the gates 84, the STI regions 58, and the silicide regions 92A and 92B. Top surfaces of the gate spacers 88 may be above or below top surfaces of the gates 84. Etching the masks 86 and the gate spacers 88 may reduce an aspect ratio (e.g., a ratio of height to width) of openings between adjacent gate stacks, which aids in the subsequent deposition of an interlayer dielectric (such as the first interlayer dielectric 96, discussed below with respect to FIG. 14). This reduces device defects and improves device performance.

Figure 14:
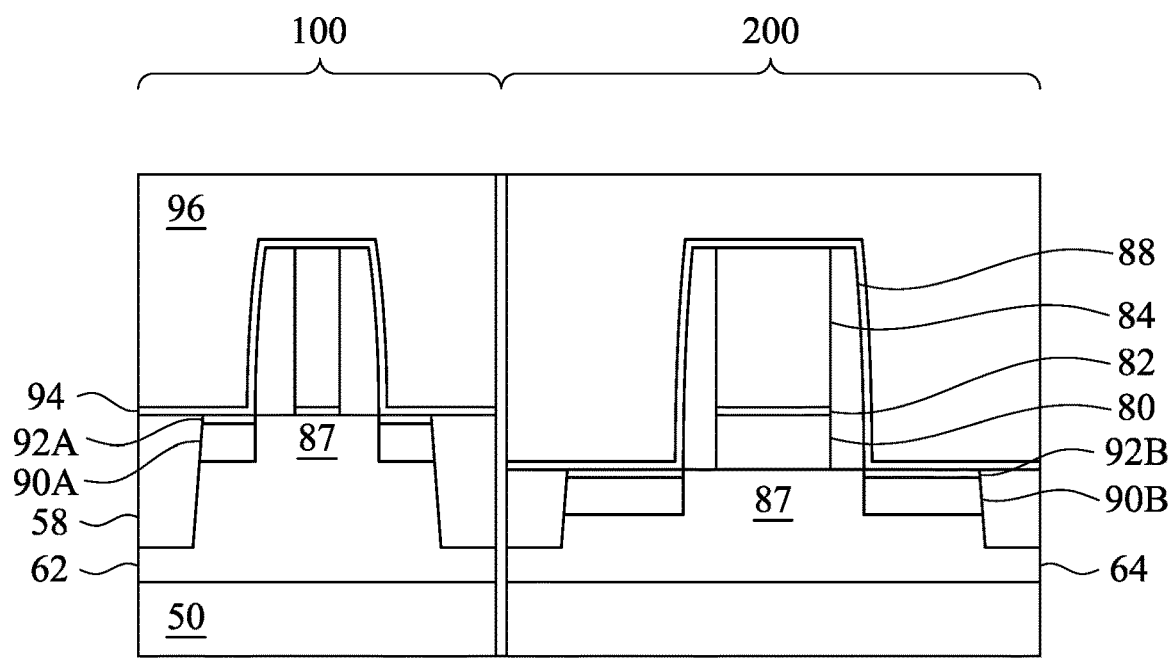

In FIG. 14, a first interlayer dielectric (ILD) 96 is deposited over the structure illustrated in FIG. 13. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the silicide regions 92A and 92B, the STI regions 58, the gate spacers 88, and the gates 84. The CESL 94 may comprise a dielectric material, such as, silicon nitride, silicon oxide, silicon oxynitride, or the like, having a lower etch rate than the material of the overlying first ILD 96.

Figure 15:
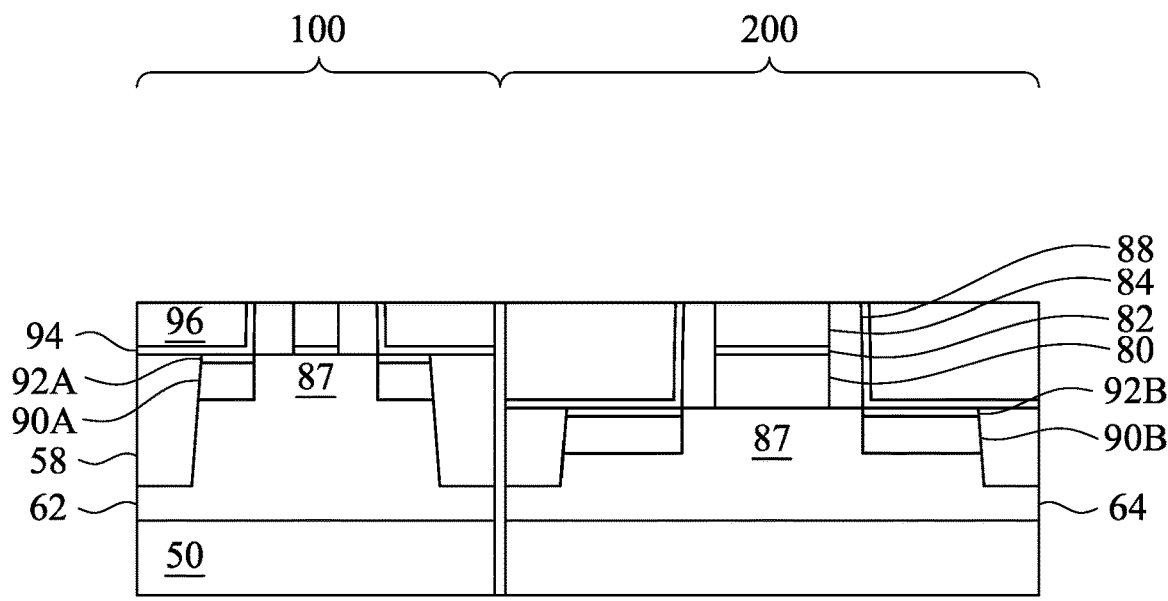

In FIG. 15, a planarization process, such as a CMP, is performed to level the top surface of the first ILD 96 with the top surfaces of the gates 84. After the planarization process, top surfaces of the gates 84, the gate spacers 88, the first ILD 96, and the CESL 94 are level. Accordingly, the top surfaces of the gates 84 are exposed through the first ILD 96 and the CESL 94.

Figure 16:
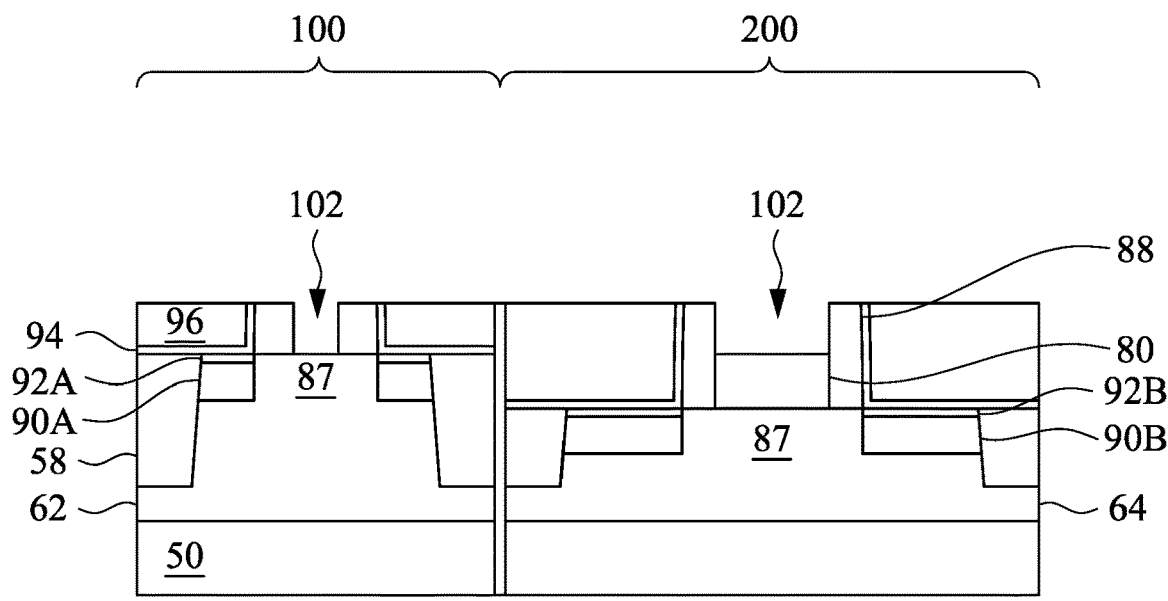

In FIG. 16, the gates 84 are removed by a suitable etching process to form recesses 102. Portions of the second gate dielectrics 82 in the recesses 102 may also be removed. In some embodiments, only the gates 84 are removed, while the second gate dielectrics 82 remain and are exposed by the recesses 102. The first gate dielectric 80 in the HV device region 200 may remain relatively un-etched. In some embodiments, the gates 84 are removed by an anisotropic dry etch process. For example, the etching process may include a dry etch process using reaction gas(es) that selectively etch the gates 84 with little or no etching of the first ILD 96, the gate spacers 88, or the CESL 94. The recess 102 in the LV device region 100 exposes and/or overlies the channel region 87 of the first well 62. The recess 102 of the HV device region 200 exposes and/or overlies the first gate dielectric 80. During the removal, the second gate dielectrics 82 may be used as etch stop layers when the gates 84 are etched. The second gate dielectrics 82 may then be optionally removed after the removal of the gates 84.

Figure 17:
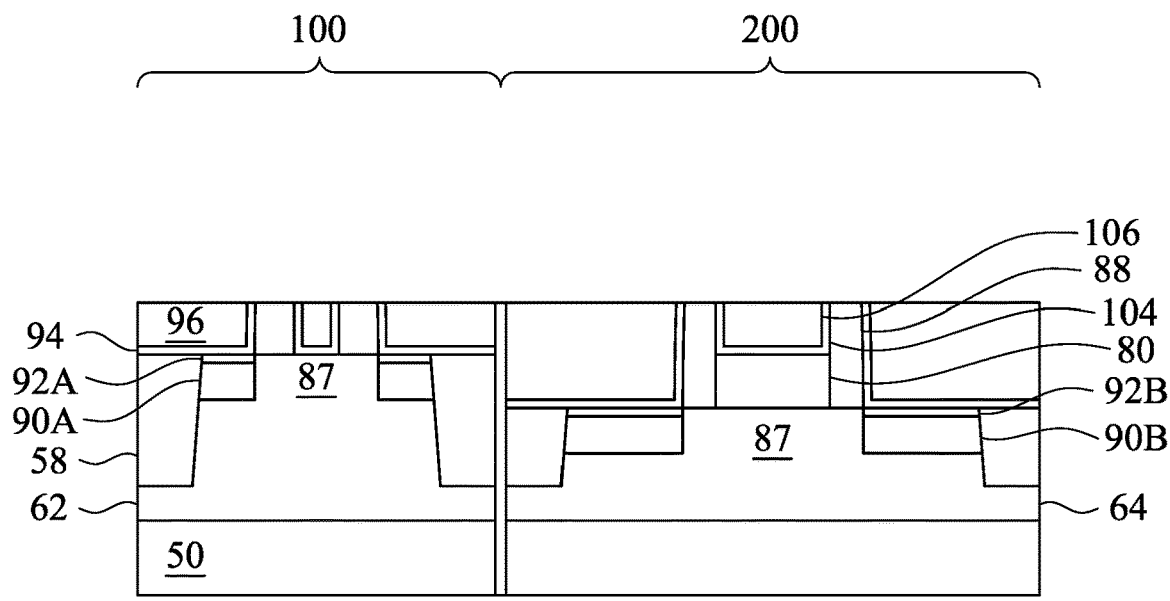

In FIG. 17, gate dielectric layers 104 and gate electrodes 106 are formed for replacement gates. The gate dielectric layers 104 may include one or more layers deposited in the recesses 102, such as on a top surface of the first well 62, a top surface of the first gate dielectric 80, and on sidewalls of the gate spacers 88. The gate dielectric layers 104 may also be formed extending along top surfaces of the first ILD 96, the CESL 94, and the gate spacers 88. In some embodiments, the gate dielectric layers 104 comprise one or more dielectric layers, such as one or more layers of silicon oxide, silicon nitride, metal oxide, metal silicate, or the like. For example, in some embodiments, the gate dielectric layers 104 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 104 may include a dielectric layer having a k-value greater than about 7.0. The formation methods of the gate dielectric layers 104 may include molecular beam deposition (MBD), ALD, PECVD, and the like. In embodiments where portions of the second gate dielectrics 82 remain in the recesses 102, the gate dielectric layers 104 may include materials of the second gate dielectrics 82 (e.g., SiO$_2$).

The gate electrodes 106 are deposited over the gate dielectric layers 104 and fill the remaining portions of the recesses 102. The gate electrodes 106 may include a metal-containing material such as titanium nitride, titanium oxide, tantalum nitride, tantalum carbide, cobalt, ruthenium, aluminum, tungsten, combinations thereof, or multi-layers thereof. Although single-layer gate electrodes 106 are illustrated in FIG. 17, the gate electrodes 106 may comprise any number of liner layers, any number of work function tuning layers, and fill materials. After the filling of the recesses 102, a planarization process, such as a CMP, may be performed to remove excess portions of the gate dielectric layers 104 and the gate electrodes 106, which excess portions are over top surfaces of the first ILD 96. The remaining portions of the gate electrodes 106 and the gate dielectric layers 104 form replacement gates of the resulting FETs. The gate electrodes 106 and the gate dielectric layers 104 in the LV device region 100 and the gate electrodes 106, the gate dielectric layers 104, and the first gate dielectric 80 in the HV device region 200 may be collectively referred to as "gate stacks." The gate stacks may extend along top surfaces of the channel regions 87 of the first well 62 and the second well 64.

The formation of the gate dielectric layers 104 in the LV device region 100 and the HV device region 200 may occur simultaneously such that the gate dielectric layers 104 in each region are formed from the same materials, and the formation of the gate electrodes 106 may occur simultaneously such that the gate electrodes 106 in each region are formed from the same materials. In some embodiments, the gate dielectric layers 104 in each region may be formed by distinct processes, such that the gate dielectric layers 104 may be different materials, and/or the gate electrodes 106 in each region may be formed by distinct processes, such that the gate electrodes 106 may be different materials. Various masking steps may be used to mask and expose appropriate regions when using distinct processes.

Figure 18:
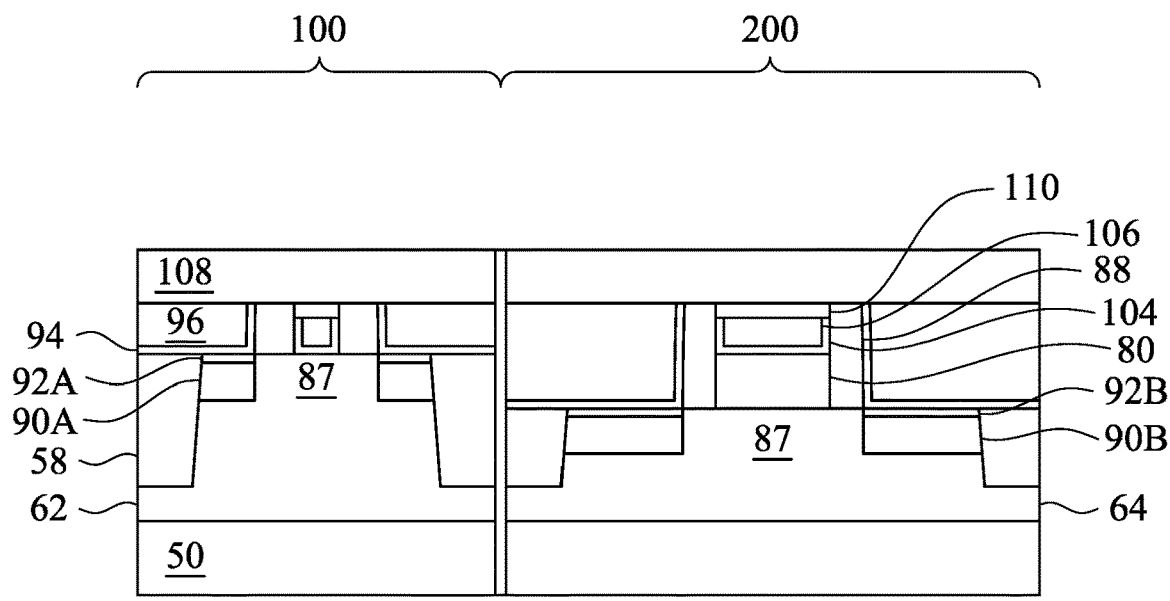

In FIG. 18, gate masks 110 are formed over the gate stacks. The gate masks 110 may be disposed between opposing portions of the gate spacers 88. In some embodiments, forming the gate masks 110 includes recessing the gate dielectric layers 104 and the gate electrodes 106 of the gate stacks so that recesses are formed directly over remaining portions of the gate stacks and between opposing portions of the gate spacers 88. The gate masks 110 comprising one or more layers of dielectric material, such as silicon nitride, silicon oxynitride, or the like, are then filled in the recesses, followed by a planarization process to remove excess portions of the dielectric material extending over the first ILD 96.

Further in FIG. 18, a second ILD 108 is deposited over the first ILD 96. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD, PECVD, or the like. Subsequently formed gate contacts (such as the gate contacts 130, discussed below with respect to FIGS. 21A through 21C) may penetrate through the second ILD 108 and the gate masks 110 to contact top surfaces of the recessed gate electrodes 106.

Figure 19A:
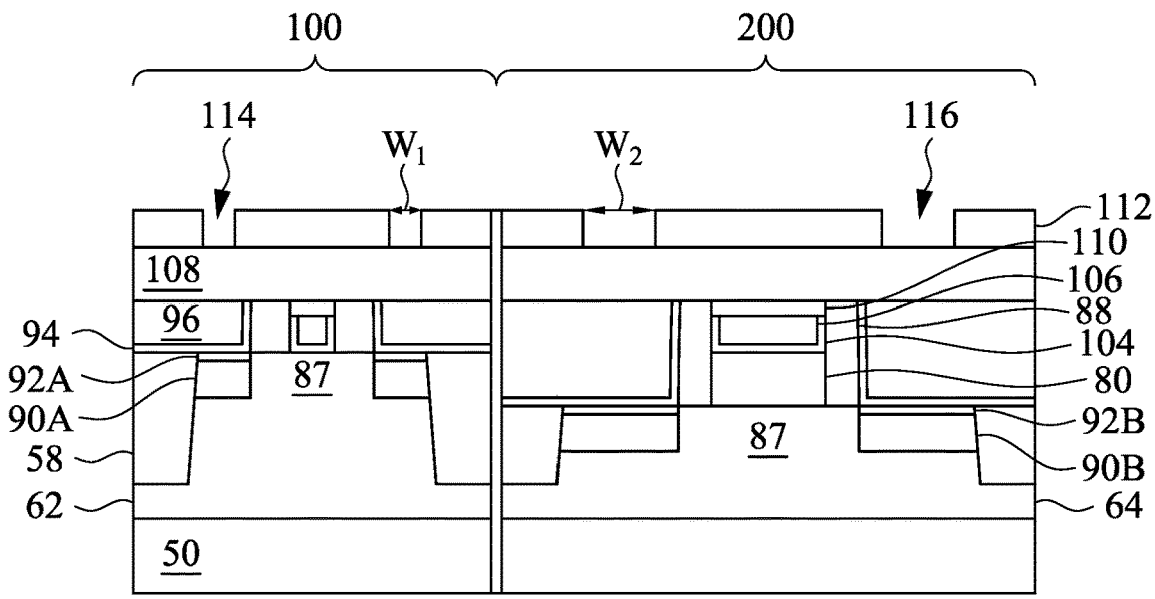
Figure 19B:
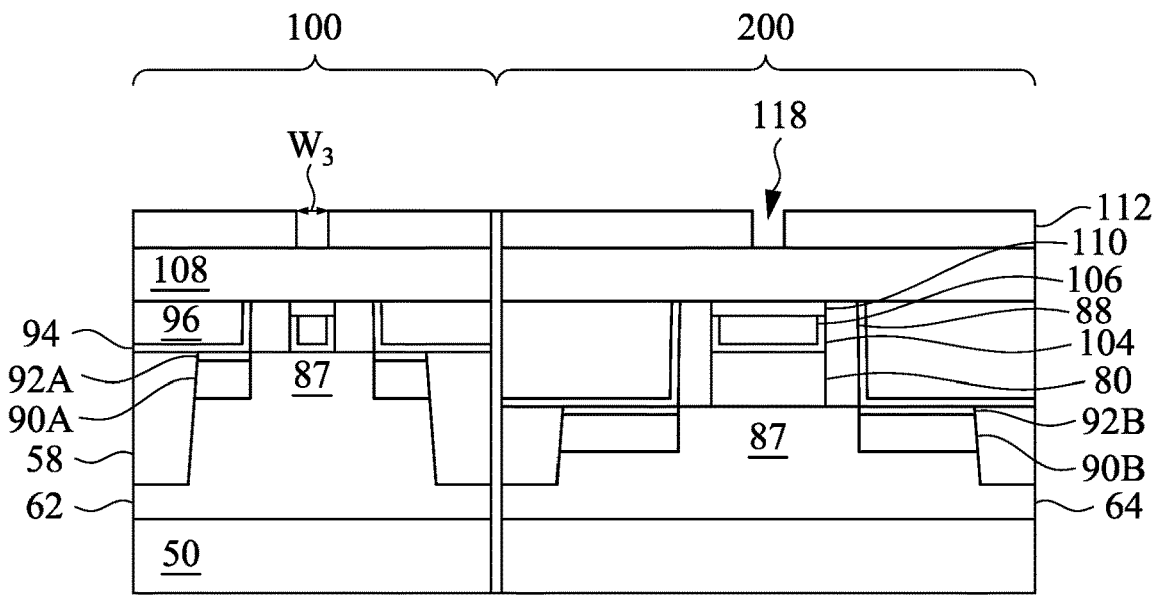
Figure 19C:
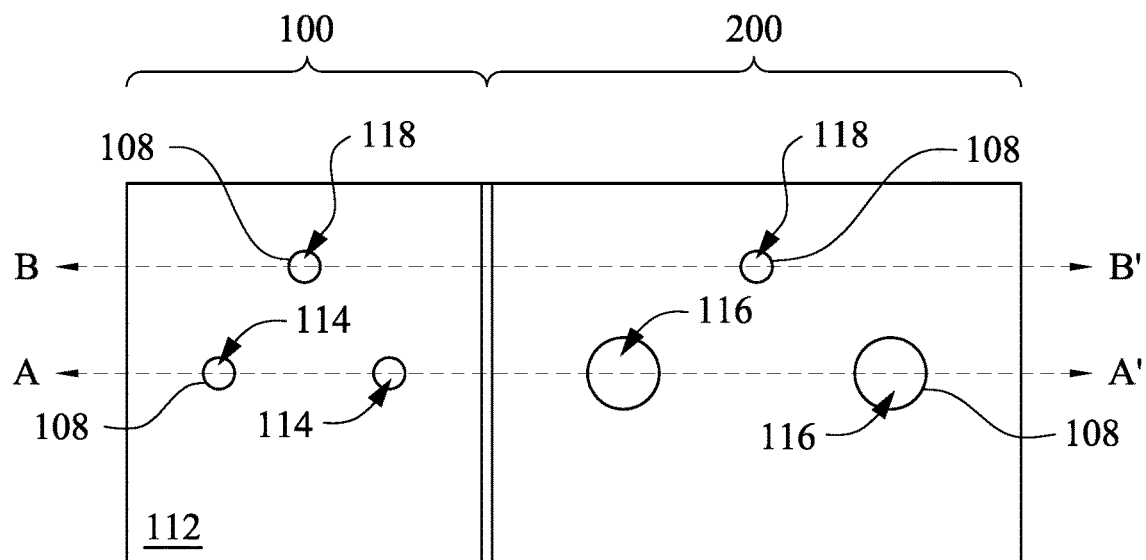

In FIGS. 19A through 19C, a patterned photoresist 112 including openings 114, 116, and 118 is formed over the second ILD 108. FIG. 19C illustrates a top-down view and further illustrates reference cross-sections used in FIGS. 19A and 19B. Cross-section A-A' extends through the openings 114 and 116 in a direction perpendicular to longitudinal axes of the gate stacks and the cross-sectional views illustrated in FIGS. 1 through 19A, 20A, and 21A are illustrated along cross-section A-A'. Cross-section B-B' is parallel to cross-section A-A', extends through the openings 118, and the cross-sectional views illustrated in FIGS. 19B, 20B, and 21B are illustrated along cross-section B-B'. As illustrated in FIG. 19B, the gate stack may extend over the STI regions 58 past side surfaces of the first well 62 and the second well 64.

The patterned photoresist 112 may be formed by depositing a photosensitive layer over the second ILD 108 using spin-on coating or the like. The photosensitive layer may then be patterned by exposing the photosensitive layer to a patterned energy source (e.g., a patterned light source) and developing the photosensitive layer to remove an exposed or unexposed portion of the photosensitive layer, thereby forming the patterned photoresist 112. Openings 114, 116, and 118, which expose the second ILD 108, are formed extending through the patterned photoresist 112. The pattern of the patterned photoresist 112 corresponds to contacts to be formed in the second ILD 108, the first ILD 96, the CESL 94, and the gate masks 110, as will be discussed below with respect to FIGS. 21A through 21C.

Figure 19D:
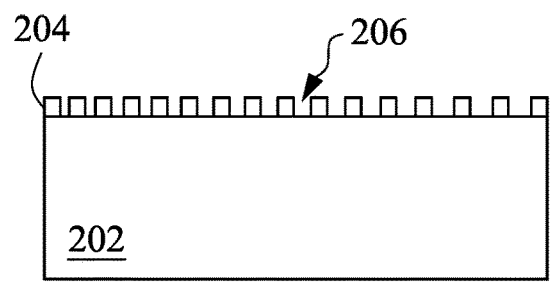
Figure 19E:
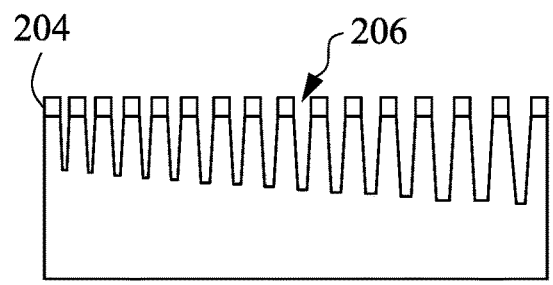

FIGS. 19D and 19E illustrate an etching loading effect, which may subsequently be used to etch the second ILD 108, the first ILD 96, the CESL 94, and the gate masks 110 using the patterned photoresist 112 as a mask, without over-etching and damaging the silicide regions 92A, the source/drain regions 90A, and the gate electrodes 106. In FIG. 19D, a substrate 202 is provided and a patterned photoresist 204 including openings 206 is formed over the substrate 202. Materials of the substrate 202 may be the same as or similar to materials of the second ILD 108, the first ILD 96, and/or the gate masks 110. In some embodiments, the substrate 202 may be formed of an oxide, such as silicon oxide or the like. The patterned photoresist 204 may be formed of materials and by processes similar to or the same as those of the patterned photoresist 112. In FIG. 19E, the openings 206 are extended into the substrate 202 simultaneously using the patterned photoresist 204 as a mask. As illustrated in FIG. 19E, as the width of the openings 206 in the patterned photoresist 204 increases, the depth to which the openings 206 extend into the substrate 202 increases. For example, a ratio of a width of each of the openings 206 to a respective depth of the opening 206 may be from about 0.02 to about 1. With respect to the openings 114, 116, and 118, the widths of the openings 114, 116, and 118, may be selected in order to control the depths of the openings patterned through the openings 114, 116, and 118 (such as the openings 120, 122, and 124, discussed below with respect to FIGS. 20A through 20C), thereby preventing over-etching of the silicide regions 92A, the source/drain regions 90A, and the gate electrodes 106.

Returning to FIGS. 19A through 19C, the openings 114 may be formed with widths $W_1$, the openings 116 may be formed with widths $W_2$, and the openings 118 may be formed with widths $W_3$. The widths $W_2$ may be greater than both the widths $W_1$ and the widths $W_3$. In some embodiments, a ratio of the widths $W_2$ to the widths $W_1$ may range from about 1.5 to about 50 or from about 1.5 to about 15 and a ratio of the widths $W_2$ to the widths $W_3$ may range from about 1.5 to about 50 or from about 1.5 to about 15. In some embodiments, the widths $W_1$ may be equal to or greater than the widths $W_3$. In some embodiments, the widths $W_1$ may range from about 10 nm to about 100 nm, the widths $W_2$ may range from about 15 nm to about 500 nm, and the widths $W_3$ may range from about 10 nm to about 100 nm. As will be discussed in further detail below with respect to FIGS. 20A through 20C, the patterned photoresist 112 may be used as a mask to extend the openings 114, 116, and 118 to expose the silicide regions 92A, the silicide regions 92B, and the gate electrodes 106, respectively. Providing the openings 114, 116, and 118 having the prescribed widths and relationships may be used to control the depth to which the openings 114, 116, and 118 are extended, preventing over-etching of the silicide regions 92A, the source/drain regions 90A, and the gate electrodes 106, while allowing for the silicide regions 92B to be exposed. Providing the openings 116 with widths $W_2$ greater than the prescribed values may create an undesirable area penalty, requiring larger source/drain regions 90B and silicide regions 92B to be formed, which may reduce device density. Providing the openings 116 with widths $W_2$ less than the prescribed values may not be sufficient to prevent over-etching of the silicide regions 92A, the source/drain regions 90A, and the gate electrodes 106, and may result in reduced device performance.

Figure 20A:
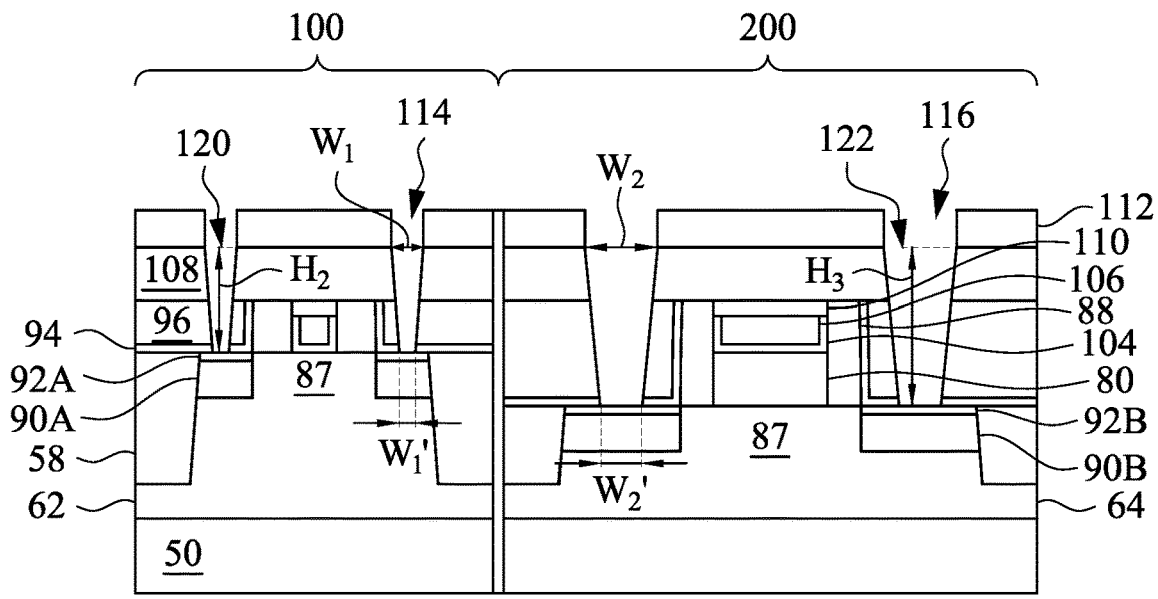
Figure 20B:
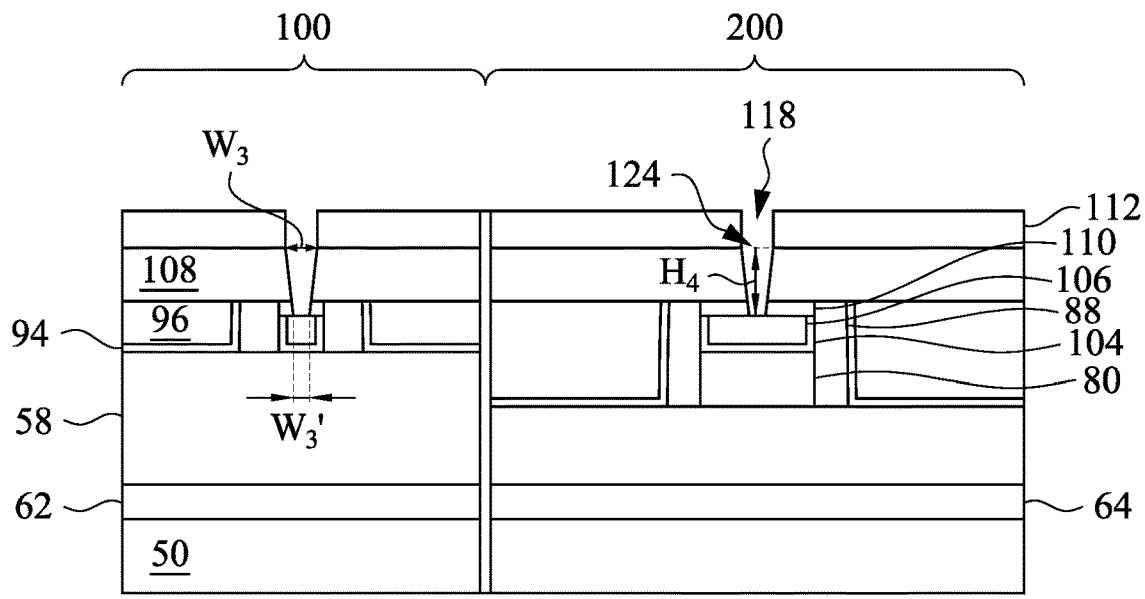
Figure 20C:
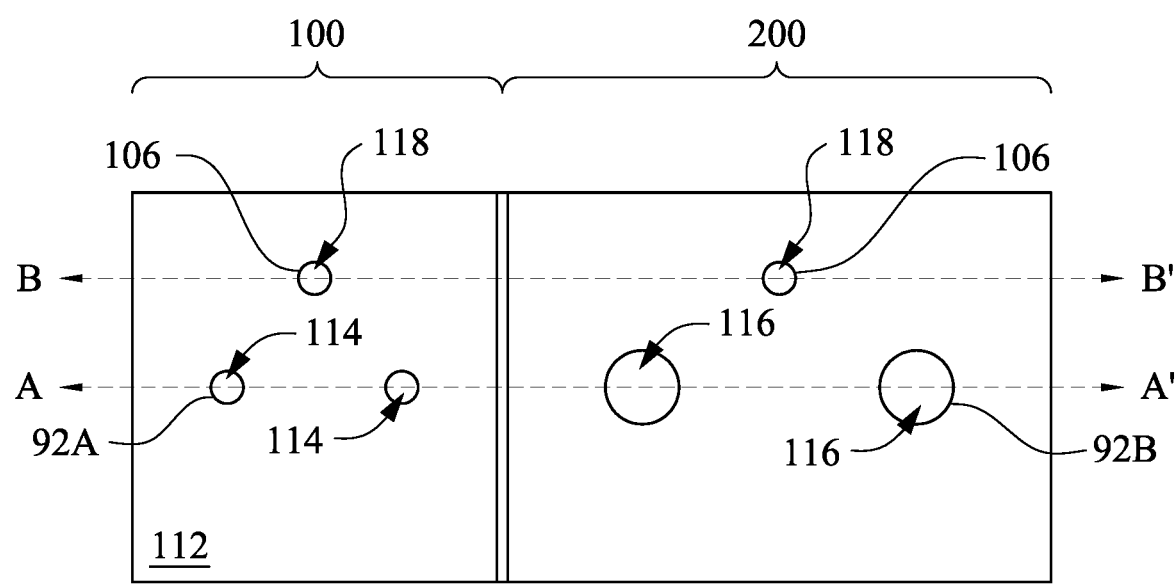

In FIGS. 20A through 20C, the patterned photoresist 112 is used as a mask to etch the second ILD 108, the first ILD 96, the CESL 94, and the gate masks 110, extending the openings 114, 116, and 118 to form openings 120, 122, and 124, respectively. The openings 120 may be etched through the second ILD 108, the first ILD 96, and the CESL 94 in the LV device region 100 and expose the silicide regions 92A. The openings 122 may be etched through the second ILD 108, the first ILD 96, and the CESL 94 in the HV device region 200 and expose the silicide regions 92B. The openings 124 may be etched through the second ILD 108 and the gate masks 110 in the LV device region 100 and the HV device region 200 and expose the gate electrodes 106 in both the LV device region 100 and the HV device region 200. The second ILD 108, the first ILD 96, the CESL 94, and the gate masks 110 may be etched using any acceptable etching processes, such as reactive ion etching (RIE), neutral beam etching (NBE), the like, or a combination thereof. The etching processes may be anisotropic.

The openings 120, 122, and 124 may be etched simultaneously. Because the openings 114, 116, and 118 are formed in the patterned photoresist 112 having the prescribed widths $W_1$, $W_2$, and $W_3$, respectively, the openings 120, 122, and 124 may be etched simultaneously and may extend to different depths. This allows for each of the silicide regions 92A, the silicide regions 92B, and the gate electrodes 106 to be exposed, without over-etching the silicide regions 92A and the gate electrodes 106. This improves device performance and reduces device defects. Moreover, additional masking processes are not required to form the openings 120, 122, and 124 having different heights. This reduces costs.

The openings 120 may have top widths $W_1$ level with top surfaces of the second ILD 108, which are equal to the widths $W_1$ of the openings 114 in the patterned photoresist 112. The openings 120 may have heights $H_2$ ranging from about 50 nm to about 1,000 nm and bottom widths $W_1'$ level with bottom surfaces of the CESL 94 ranging from about 10 nm to about 100 nm. The openings 122 may have top widths $W_2$ level with top surfaces of the second ILD 108, which are equal to the widths $W_2$ of the openings 116 in the patterned photoresist 112. The openings 122 may have heights $H_3$ ranging from about 100 nm to about 1,500 nm and bottom widths $W_2'$ level with bottom surfaces of the CESL 94 ranging from about 15 nm to about 500 nm. The openings 124 may have top widths $W_3$ level with top surfaces of the second ILD 108, which are equal to the widths $W_3$ of the openings 118 in the patterned photoresist 112. The openings 124 may have heights $H_4$ ranging from about 50 nm to about 1,000 nm and bottom widths $W_3'$ level with bottom surfaces of the gate masks 110 ranging from about 10 nm to about 100 nm. The heights $H_3$ may be greater than the heights $H_2$ and the heights $H_2$ may be greater than the heights $H_4$. In some embodiments, a ratio of the heights $H_3$ to the heights $H_2$ may range from about 1.5 to about 50 ($H_3/H_2$) and a ratio of the heights $H_3$ to the heights $H_4$ may range from about 1.5 to about 50 ($H_3/H_4$). In some embodiments, the widths $W_2'$ may be equal to or greater than the widths $W'$. Forming the openings 122 with the widths $W_2'$ greater than the widths $W_1'$ may reduce contact resistances of contacts subsequently formed in the openings 122, which may improve device performance.

Figure 21A:
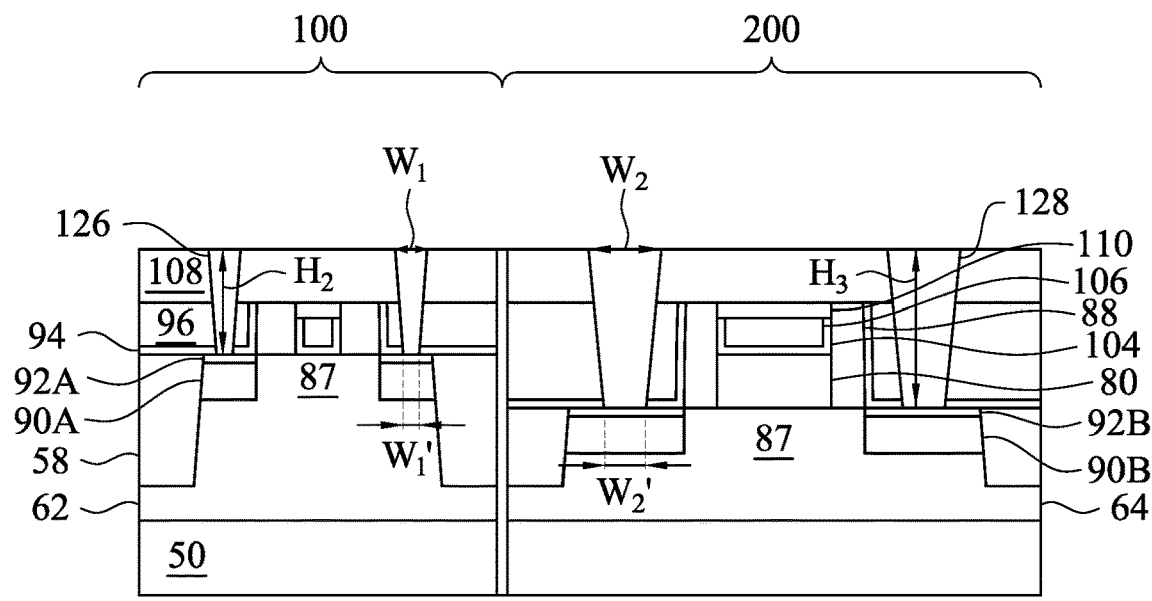
Figure 21B:
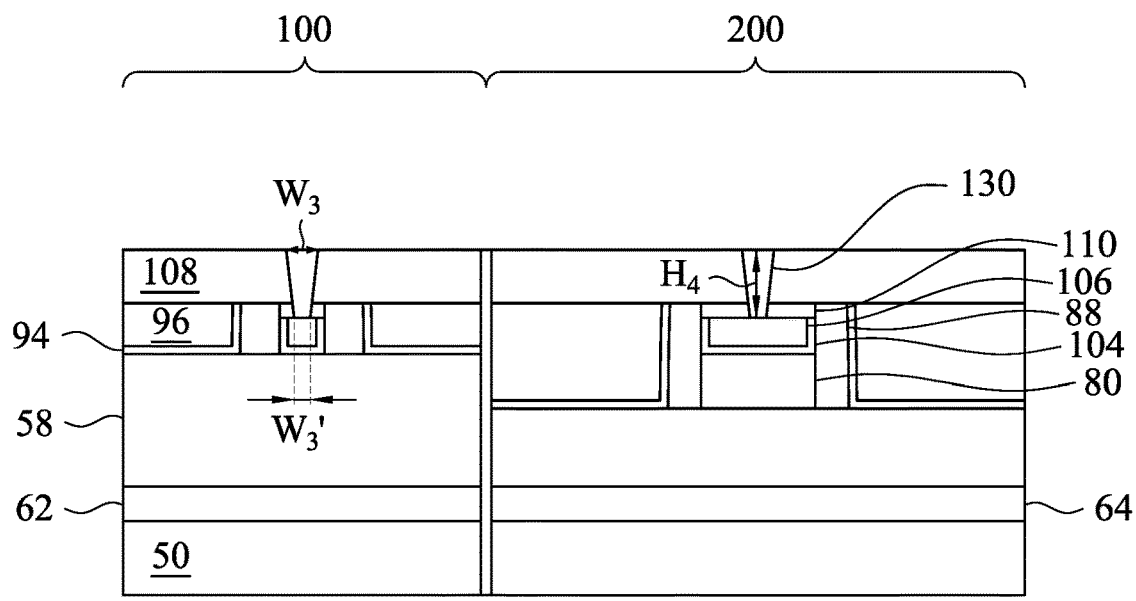
Figure 21C:
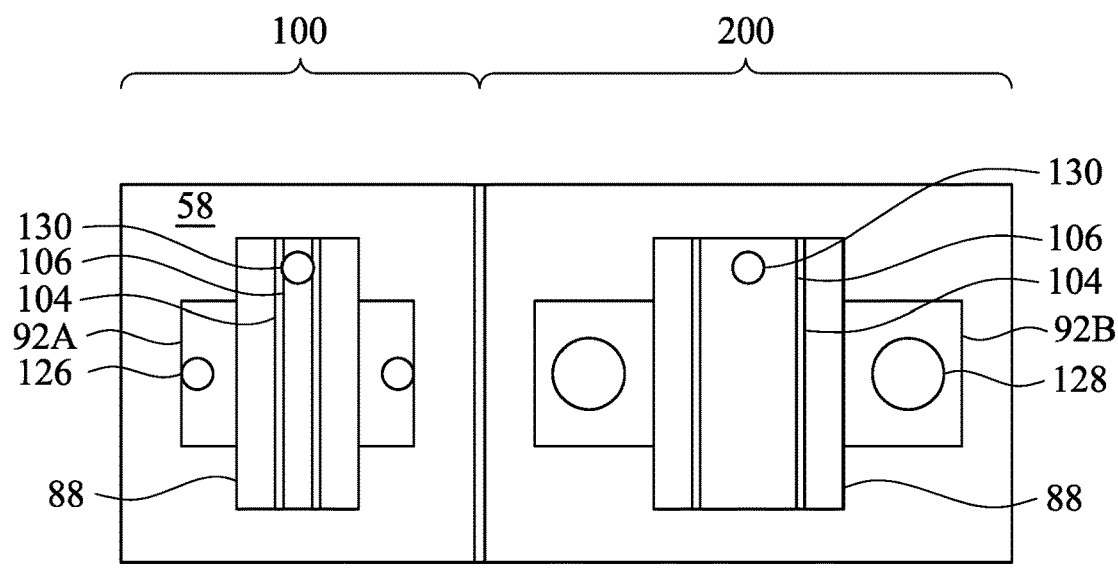

In FIGS. 21A through 21C, the patterned photoresist 112 is removed and LV contacts 126, HV contacts 128, and gate contacts 130 are formed in the openings 120, 122, and 124, respectively. FIG. 21C illustrates a top-down view in which the second ILD 108 and the first ILD 96 have been removed to show the underlying structures. The patterned photoresist 112 may be removed by an acceptable ashing or stripping process, such as using an oxygen plasma or the like. The LV contacts 126, HV contacts 128, and gate contacts 130 are formed by depositing a liner (not separately illustrated), such as a diffusion barrier layer, an adhesion layer, or the like, in the openings 122, 124, and 126 and depositing a conductive material over the liner and filling the openings 122, 124, and 126. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the LV contacts 126, HV contacts 128, and gate contacts 130. The LV contacts 126 are physically and electrically coupled to the source/drain regions 90A through the silicide regions 92A. The HV contacts 128 are physically and electrically coupled to the source/drain regions 90B through the silicide regions 92B. The gate contacts 130 are physically and electrically coupled to the gate electrodes 106. The LV contacts 126, HV contacts 128, and gate contacts 130 may be formed in different processes, or may be formed in the same process.

The LV contacts 126, HV contacts 128, and gate contacts 130 may have the same dimensions as the openings 120, 122, and 124, respectively. For example, the LV contacts 126 may have the widths $W_1$, the widths $W_1'$ and the heights $H_2$; the HV contacts 128 may have the widths $W_2$, the widths $W_2'$ and the heights $H_3$; and the gate contacts 130 may have the widths $W_3$, the widths $W_3'$ and the heights $H_4$. The widths $W_3$ and the heights $H_4$ of the gate contacts 130 may be the same in the LV device region 100 and the HV device region 200. Ratios of the widths $W_1$ to the heights $H_2$ may range from about 0.01 to about 0.2; ratios of the widths $W_2$ to the heights $H_3$ may range from about 0.01 to about 0.2; and ratios of the widths $W_3$ to the heights $H_4$ may range from about 0.01 to about 0.2.

Figure 21D:
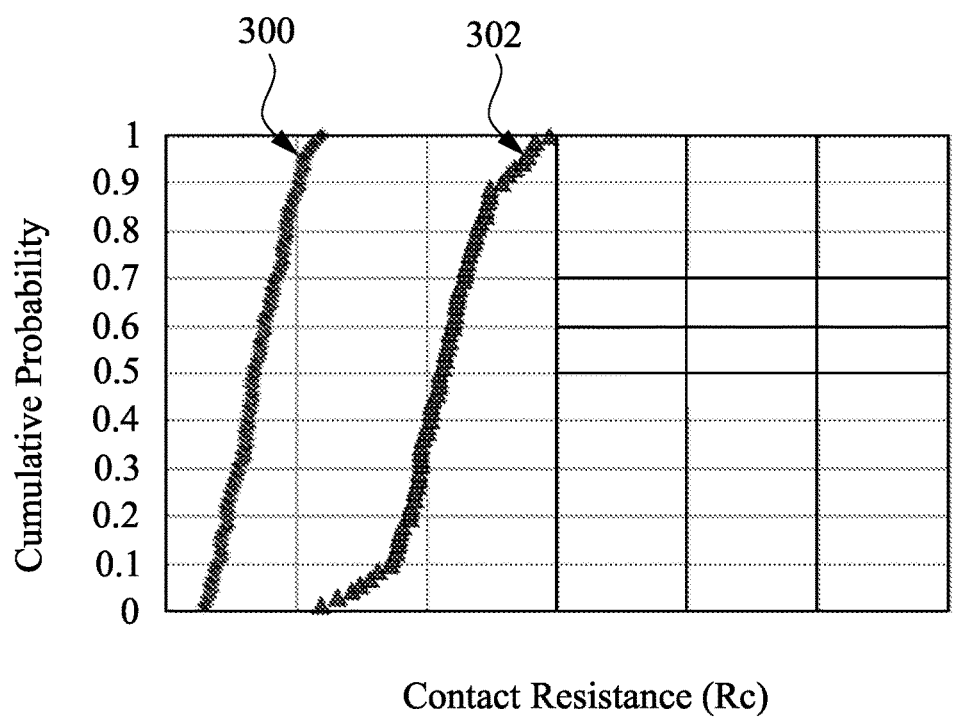
FIG. 21D illustrates a graph of material properties of a contact, in accordance with some embodiments.

FIG. 21D illustrates the cumulative probability as a function of contact resistance (Rc) between the HV contacts 128 and the silicide regions 92B. Line 300 illustrates an embodiment in which the HV contacts 128 are formed with larger widths than the LV contacts 126. Line 302 illustrates an embodiment in which the HV contacts 128 are formed with widths equal to the widths of the LV contacts 126. As illustrated in FIG. 21D, providing the HV contacts 128 with larger widths reduces the contact resistance of the HV contacts 128 and reduces variance in the contact resistance of the HV contacts 128. Specifically, the contact resistance for the embodiment illustrated by line 300 is 15 percent or greater less than the contact resistance for the embodiment illustrated by line 302. This improves device performance and reduces device defects.

Embodiments may achieve various advantages. For example, forming the openings 114, 116, and 118 in the patterned photoresist 112 with different widths allows for the openings 120, 122, and 124 to be formed simultaneously, without over-etching the silicide regions 92A, the source/drain regions 90A, and the gate electrodes 106, which are disposed above the silicide regions 92B. This prevents device defects, improves device performance, and reduces the number of masks required to pattern the openings 120, 122, and 124, which reduces costs. Moreover, the HV contacts 128 may be formed with greater widths, which reduces contact resistance and further improves device performance.

The disclosed planar FET embodiments could also be applied to fin devices, such as fin field effect transistors (FinFETs), nanostructure devices, such as nanostructure (e.g., nanosheet, nanowire, gate-all-around, or the like) field effect transistors (NSFETs), or the like. In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

In accordance with an embodiment, a semiconductor device includes a first channel region in a semiconductor substrate adjacent a first source/drain region; a first gate stack over the first channel region; a second channel region in the semiconductor substrate adjacent a second source/drain region, a top surface of the second channel region being disposed below a top surface of the first channel region; a second gate stack over the second channel region; an interlayer dielectric (ILD) over the first gate stack, the second gate stack, the first source/drain region, and the second source/drain region; a first source/drain contact extending through the ILD and electrically coupled to the first source/drain region, the first source/drain contact having a first width and a first height; and a second source/drain contact extending through the ILD and electrically coupled to the second source/drain region, the second source/drain contact having a second width greater than the first width and a second height greater than the first height. In an embodiment, the semiconductor device further includes a first gate contact electrically coupled to the first gate stack; and a second gate contact electrically coupled to the second gate stack, the first gate contact having a third width and a third height, the second gate contact having a fourth width equal to the third width and a fourth height equal to the third height. In an embodiment, the second width is greater than each of the third width and the fourth width, and the second height is greater than each of the third height and the fourth height. In an embodiment, top surfaces of the first source/drain contact, the second source/drain contact, the first gate contact, and the second gate contact are level with one another, a bottom surface of the second source/drain contact is disposed below a bottom surface of the first source/drain contact, and the bottom surface of the first source/drain contact is disposed below bottom surfaces of the first gate contact and the second gate contact. In an embodiment, the first width is equal to each of the third width and the fourth width. In an embodiment, the first height is greater than to each of the third height and the fourth height. In an embodiment, a ratio of the second width to the first width is from 1.5 to 50.

In accordance with another embodiment, a semiconductor device includes a first transistor including a first gate stack over a semiconductor substrate, the first gate stack having a first height; a first source/drain region adjacent the first gate stack; a first gate contact electrically coupled to the first gate stack, a top surface of the first gate contact having a first width; and a first source/drain contact electrically coupled to the first source/drain region, a top surface of the first source/drain contact having a second width greater than the first width; and a second transistor including a second gate stack over the semiconductor substrate, the second gate stack having a second height less than the first height; a second source/drain region adjacent the second gate stack; and a second source/drain contact electrically coupled to the second source/drain region, a top surface of the second source/drain contact having a third width less than the second width. In an embodiment, a ratio of the second width to the first width is from 1.5 to 50 and a ratio of the second width to the third width is from 1.5 to 50. In an embodiment, the first transistor further includes a first channel region, the first gate stack includes a first dielectric material in contact with the first channel region, the second transistor further includes a second channel region, and the second gate stack includes the first dielectric material separated from the second channel region by a gate oxide layer. In an embodiment, a top surface of the first channel region is disposed a first distance above a top surface of the second channel region in a direction perpendicular to a major surface of the semiconductor substrate, and a thickness of the gate oxide layer is equal to the first distance. In an embodiment, a top surface of the first gate stack is level with a top surface of the second gate stack. In an embodiment, a bottom surface of the first source/drain contact has a fourth width greater than a fifth width of a bottom surface of the second source/drain contact. In an embodiment, the top surface of the first source/drain contact, the top surface of the second source/drain contact, and the top surface of the first gate contact are level with one another, the first source/drain contact has a first height greater than a second height of the second source/drain contact, and the second height is greater than a third height of the first gate contact.

In accordance with yet another embodiment, a method includes forming a first transistor and a second transistor over a semiconductor substrate, the first transistor including a first gate stack and a first source/drain region adjacent the first gate stack, the second transistor including a second gate stack and a second source/drain region adjacent the second gate stack; forming an interlayer dielectric (ILD) over the first transistor and the second transistor; depositing a photoresist over the ILD; patterning the photoresist to form a patterned photoresist including a first opening directly over the first source/drain region, a second opening directly over the second source/drain region, and a third opening directly over the first gate stack, the first opening having a first width, the second opening having a second width, the third opening having a third width, the first width being greater than each of the second width and the third width; etching the ILD using the patterned photoresist as a mask; and forming a first contact electrically coupled to the first source/drain region, a second contact electrically coupled to the second source/drain region, and a third contact electrically coupled to the first gate stack, the first contact having a first height greater than each of a second height of the second contact and a third height of the third contact. In an embodiment, forming the first transistor and the second transistor includes recessing a first region of the semiconductor substrate relative to a second region of the semiconductor substrate, the first transistor being formed in the first region and the second transistor being formed in the second region. In an embodiment, forming the first transistor and the second transistor further includes forming a gate oxide layer over the first region and the second region; and removing the gate oxide layer from the second region, the first gate stack including a remaining portion of the gate oxide layer. In an embodiment, the method further includes planarizing top surfaces of the first gate stack, the second gate stack, and the ILD. In an embodiment, forming the first contact, the second contact, and the third contact further includes planarizing top surfaces of the first contact, the second contact, the third contact and the ILD. In an embodiment, the third width is equal to the second width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first channel region in a semiconductor substrate adjacent a first source/drain region;
a first gate stack over the first channel region, wherein the first gate stack comprises a first gate dielectric layer in contact with the first channel region;
a second channel region in the semiconductor substrate adjacent a second source/drain region;
a second gate stack over the second channel region, wherein the second gate stack comprises a second gate dielectric layer and a third gate dielectric layer between the second gate dielectric layer and the second channel region, wherein an upper surface of the semiconductor substrate under the second gate stack is lower than an upper surface of the semiconductor substrate under the first gate stack; and
an interlayer dielectric (ILD) over the first gate stack, the second gate stack, the first source/drain region, and the second source/drain region.

2. The semiconductor device of claim 1, further comprising:
a first source/drain contact extending through the ILD and electrically coupled to the first source/drain region, the first source/drain contact having a first height; and
a second source/drain contact extending through the ILD and electrically coupled to the second source/drain region, the second source/drain contact having a second height greater than the first height.

3. The semiconductor device of claim 2, wherein the first source/drain contact has a first width at an upper surface of the ILD, wherein the second source/drain contact has a second width at the upper surface of the ILD, wherein the second width is greater than the first width.

4. The semiconductor device of claim 3, further comprising:
a first gate contact extending through the ILD to the first gate stack; and
a second gate contact extending through the ILD to the second gate stack, wherein a first gate contact height of the first gate contact is substantially the same as a second gate contact height of the second gate contact.

5. The semiconductor device of claim 4, wherein the second width of the second source/drain contact is greater than a first gate contact width of the first gate contact and a second gate contact width of the second gate contact.

6. The semiconductor device of claim 5, wherein the first width of the first source/drain contact is equal to the first gate contact width of the first gate contact and the second gate contact width of the second gate contact.

7. The semiconductor device of claim 1, wherein the first gate stack comprises a first gate electrode over the first gate dielectric layer, wherein the second gate stack comprises a second gate electrode over the second gate dielectric layer, wherein a height of the first gate electrode is substantially same as a height of the second gate electrode.

8. A semiconductor device comprising:
a first transistor comprising:
a first gate stack over a semiconductor substrate, the first gate stack having a first gate dielectric, the first gate dielectric having a first thickness;
a first source/drain region adjacent the first gate stack; and
a first source/drain contact electrically coupled to the first source/drain region, a top surface of the first source/drain contact having a first width; and
a second transistor comprising:
a second gate stack over the semiconductor substrate, the second gate stack having a second gate dielectric, the second gate dielectric having a second thickness less than the first thickness, wherein an upper surface of the first gate stack is level with an upper surface of the second gate stack;
a second source/drain region adjacent the second gate stack; and
a second source/drain contact electrically coupled to the second source/drain region, a top surface of the second source/drain contact having a second width less than the first width.

9. The semiconductor device of claim 8, wherein the first gate dielectric comprises a plurality of dielectric layers.

10. The semiconductor device of claim 9, where the second gate dielectric comprises a first layer of a first material, wherein a topmost dielectric layer of the plurality of dielectric layers comprises the first material.

11. The semiconductor device of claim 8, further comprising:
a first gate contact electrically coupled to the first gate stack; and
a second gate contact electrically coupled to the second gate stack, wherein a top surface of the first gate contact and a top surface of the second gate contact have a first gate contact width, wherein the first gate contact and the second gate contact have a first gate contact height.

12. The semiconductor device of claim 11, wherein the second width is greater than the first gate contact width.

13. The semiconductor device of claim 8, wherein a ratio of the first width to the second width is from 1.5 to 50.

14. A semiconductor device comprising:
a first gate stack over a semiconductor substrate, wherein the first gate stack comprises a first gate dielectric in contact with semiconductor substrate;
a first source/drain region in the semiconductor substrate adjacent the first gate stack;
a second gate stack over the semiconductor substrate, wherein the second gate stack comprises a second gate dielectric in contact with semiconductor substrate, wherein the second gate dielectric comprises at least one more dielectric layer than the first gate dielectric, wherein an upper surface of the first gate stack is level with an upper surface of the second gate stack;
a second source/drain region in the semiconductor substrate adjacent the second gate stack;
an interlayer dielectric (ILD) over the first gate stack, the second gate stack, the first source/drain region, and the second source/drain region;
a first source/drain contact extending through the ILD and electrically coupled to the first source/drain region, the first source/drain contact having a first height; and
a second source/drain contact extending through the ILD and electrically coupled to the second source/drain region, the second source/drain contact having a second height greater than the first height.

15. The semiconductor device of claim 14, wherein the first source/drain contact has a first width, wherein the second source/drain contact has a second width, wherein the first width is less than the second width.

16. The semiconductor device of claim 14, wherein a thickness of the second gate dielectric is greater than a thickness of the first gate dielectric.

17. The semiconductor device of claim 14, wherein a top dielectric layer of the second gate dielectric is a same material as a top dielectric layer of the first gate dielectric.

18. The semiconductor device of claim 17, wherein the top dielectric layer of the second gate dielectric has a same thickness as the top dielectric layer of the first gate dielectric.

19. The semiconductor device of claim 14, further comprising:
   a first gate contact on the first gate stack; and
   a second gate contact on the second gate stack, wherein the first gate contact and the second gate contact have a same height.

20. The semiconductor device of claim 19, wherein an upper surface of the first gate contact is level with an upper surface of the second gate contact.

\* \* \* \* \*